US011550186B2

(12) United States Patent
Tsuzuki et al.

(10) Patent No.: US 11,550,186 B2
(45) Date of Patent: Jan. 10, 2023

(54) ENCAPSULANT SHEET FOR SELF-LUMINOUS DISPLAY OR ENCAPSULANT SHEET FOR DIRECT BACKLIGHT, SELF-LUMINOUS DISPLAY, AND DIRECT BACKLIGHT

(71) Applicant: DAI NIPPON PRINTING CO., LTD., Tokyo (JP)

(72) Inventors: Atsuo Tsuzuki, Tokyo (JP); Keita Arihara, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 228 days.

(21) Appl. No.: 17/058,443

(22) PCT Filed: May 24, 2019

(86) PCT No.: PCT/JP2019/020779
§ 371 (c)(1),
(2) Date: Nov. 24, 2020

(87) PCT Pub. No.: WO2019/225761
PCT Pub. Date: Nov. 28, 2019

(65) Prior Publication Data
US 2021/0223629 A1    Jul. 22, 2021

(30) Foreign Application Priority Data

May 24, 2018  (JP) .............................. JP2018-099952
Jun. 11, 2018  (JP) .............................. JP2018-110790
Jul. 26, 2018  (JP) .............................. JP2018-140518

(51) Int. Cl.
*G02F 1/13357*    (2006.01)
*C09J 7/24*    (2018.01)
(Continued)

(52) U.S. Cl.
CPC ........ *G02F 1/133608* (2013.01); *C09J 7/243* (2018.01); *C09J 7/381* (2018.01);
(Continued)

(58) Field of Classification Search
CPC ......... G02F 1/133608; G02F 1/133603; G02F 1/133606; C09J 7/243; C09J 7/381;
(Continued)

(56) References Cited

U.S. PATENT DOCUMENTS

2007/0227585 A1    10/2007  Yoshimine
2012/0218318 A1    8/2012   Hirao et al.
(Continued)

FOREIGN PATENT DOCUMENTS

JP    H02-305838 A    12/1990
JP    2007-294869 A   11/2007
(Continued)

OTHER PUBLICATIONS

Aug. 8, 2019 Search Report issued International Patent Application No. PCT/JP2019/020779.
(Continued)

*Primary Examiner* — Mary Ellen Bowman
(74) *Attorney, Agent, or Firm* — Oliff PLC

(57) ABSTRACT

An encapsulant sheet suitable for encapsulating a light-emitting element in a self-luminous display, etc. A resin sheet having a polyolefin as a base resin, wherein the resin sheet is created as an encapsulant sheet for a self-luminous display or for a direct backlight, the melt viscosity of the encapsulant sheet, at a shear velocity of 2.43×10 sec-1 and measured at a temperature of 120° C., being 5.0×103 poise to 1.0×105 poise inclusive.

43 Claims, 8 Drawing Sheets

(51) Int. Cl.
    *C09J 7/38*     (2018.01)
    *H01L 25/075*   (2006.01)
    *H01L 33/00*    (2010.01)
    *H01L 33/56*    (2010.01)
    *H01L 33/62*    (2010.01)

(52) U.S. Cl.
    CPC .. *G02F 1/133603* (2013.01); *G02F 1/133606* (2013.01); *H01L 25/0753* (2013.01); *H01L 33/0095* (2013.01); *H01L 33/56* (2013.01); *H01L 33/62* (2013.01); *C09J 2423/00* (2013.01); *C09J 2423/046* (2013.01); *C09J 2451/00* (2013.01); *H01L 2933/005* (2013.01)

(58) Field of Classification Search
    CPC . H01L 25/0753; H01L 33/0095; H01L 33/56; H01L 33/62
    See application file for complete search history.

(56) References Cited

U.S. PATENT DOCUMENTS

| | | |
|---|---|---|
| 2015/0355504 A1 | 12/2015 | Uchimi |
| 2016/0289499 A1 | 10/2016 | Yoshida et al. |
| 2018/0019233 A1 | 1/2018 | Chang et al. |
| 2018/0166615 A1 | 6/2018 | Takagishi |

FOREIGN PATENT DOCUMENTS

| | | |
|---|---|---|
| JP | 2010-109240 A | 5/2010 |
| JP | 2012-175066 A | 9/2012 |
| JP | 2013-127970 A | 6/2013 |
| JP | 2013-191754 A | 9/2013 |
| JP | 2013-211401 A | 10/2013 |
| JP | 2014-148584 A | 8/2014 |
| JP | 2014-179634 A | 9/2014 |
| JP | 2015-032647 A | 2/2015 |
| JP | 2015-195338 A | 11/2015 |
| JP | 2015-232651 A | 12/2015 |
| JP | 2016-078260 A | 5/2016 |
| JP | 2016-191038 A | 11/2016 |
| JP | 2017-009725 A | 1/2017 |
| JP | 2018-014481 A | 1/2018 |
| JP | 6311832 B1 | 4/2018 |
| JP | 6329330 B1 | 5/2018 |
| WO | 2012/145237 A1 | 10/2012 |
| WO | 2016/117268 A1 | 7/2016 |

OTHER PUBLICATIONS

Mar. 29, 2022 Office Action issued in Japanese Patent Application No. 2020-109690.

Mar. 29, 2022 Office Action issued in Japanese Patent Application No. 2020-109691.

Aug. 17, 2021 Office Action issued in Japanese Patent Application No. 2020-109690.

ENCAPSULANT SHEET FOR SELF-LUMINOUS DISPLAY OR ENCAPSULANT SHEET FOR DIRECT BACKLIGHT, SELF-LUMINOUS DISPLAY, AND DIRECT BACKLIGHT

TECHNICAL FIELD

The present disclosure relates an encapsulant sheet for self-luminous displays or for direct backlights, a self-luminous display, and a direct backlight.

BACKGROUND ART

The development of a self-luminous display for which a micro-LED television is representative has been advancing as a next generation display device in place of various display devices of liquid crystal type (Patent Document 1).
Patent Document 1: Japanese Unexamined Patent Application, Publication No. 2018-14481
Patent Document 2: Japanese Unexamined Patent Application, Publication No. 2017-9725
Patent Document 3: Japanese Unexamined Patent Application, Publication No. 2014-148584

DISCLOSURE OF THE INVENTION

Problems to be Solved by the Invention

The present disclosure has an object of providing a suitable encapsulant sheet for encapsulating of light emitting elements in a self-luminous display or the like.

Means for Solving the Problems

One of the embodiments of the present disclosure is an encapsulant sheet for self-luminous displays or direct backlights, which is a resin sheet with polyolefin as the base resin, in which the melt viscosity measured at a temperature of 120° C. and at a shear rate of $2.43 \times 10$ sec$^{-1}$ is at least $5.0 \times 10^3$ poise and no more than $1.0 \times 10^5$ poise.

Another one of the embodiments of the present disclosure is an encapsulant sheet for self-luminous displays or direct backlights, which is a single-layer or a multi-layer resin sheet configured to include an adhesive layer exposed at the topmost surface, in which the adhesive layer contains polyolefin and a silane component, and content of the silane component relative to the resin component of the adhesive layer is at least 0.02% by mass and no more than 0.15% by mass.

Another one of the embodiments of the present disclosure is an encapsulant sheet for self-luminous displays or direct backlights, in which one surface is an adhesive surface, and the other surface is a peeling surface, the adhesive strength of the adhesive surface measured by a predetermined adhesion test explained below is at least 5.0 N/15 mm and no more than 50.0 N/15 mm, and the adhesive strength of the peeling surface is at least 0.1 N/15 mm and no more than 3.0 N/15 mm.

Effects of the Invention

According to the present disclosure, a suitable encapsulant sheet for encapsulating light emitting elements of self-luminous displays, etc., a self-luminous display made using this, and the like are provided.

PREFERRED MODE FOR CARRYING OUT THE INVENTION

Figure 1:
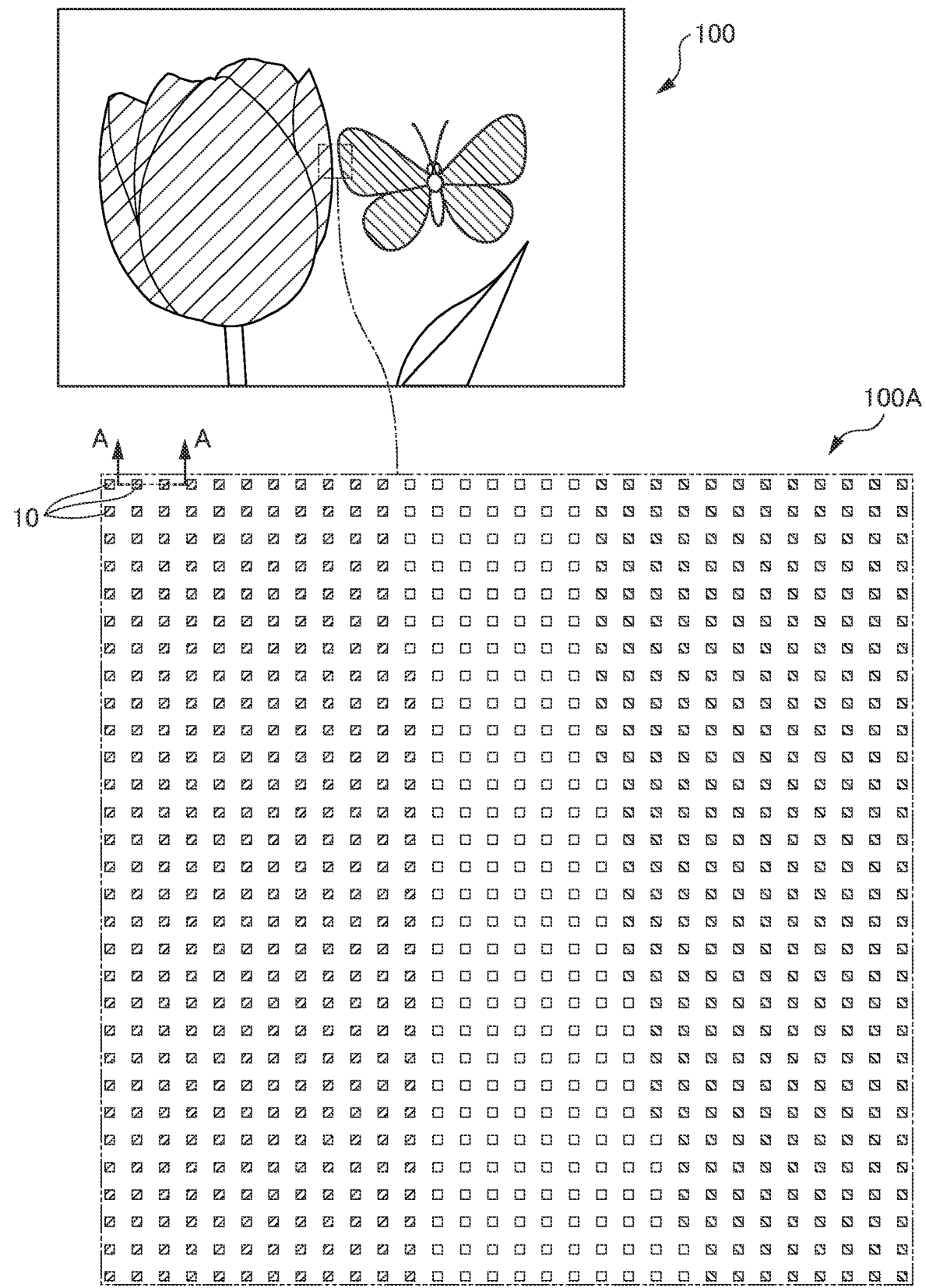
FIG. 1 is a plan view and a partially enlarged plan view of an image display surface of a self-luminous display made using LED modules for self-luminous displays in which an encapsulant sheet of a first embodiment is laminated on a light emitting module.

Hereinafter, embodiments (hereinafter called "present embodiment) of the present disclosure will be explained. It should be noted that "polyolefin" in the present embodiment is synonymous with "olefin-based resin" and "olefinic resin".

First Embodiment Encompassed by Present Embodiment

More specifically, the first embodiment provides the following configuration.
A first aspect of the present invention is an encapsulant sheet for self-luminous displays or direct backlights, in which the encapsulant sheet is a resin sheet with polyolefin as a base resin, in which melt viscosity of the encapsulant sheet measured at a shear rate of $2.43 \times 10$ sec$^{-1}$ at a temperature of 120° C. is at least $5.0 \times 10^3$ poise and no more than $1.0 \times 10^5$ poise.
The first aspect of the present invention emphasizes the viscosity of the base resin during hot pressing in the encapsulant sheet encapsulating an electronic device, and optimizes the melt viscosity at a temperature of 120° C. to within a predetermined range. It is thereby possible to achieve at high levels both the molding property during hot pressing of the encapsulant sheet, and suppression of squeezing out of resin caused by excessive flow. Then, it is further possible to favorably maintain uniformity in the film thickness of the encapsulant sheet after hot pressing. In this way, according to the first aspect of the present invention, it is possible to obtain an encapsulant sheet superior in suitability for a self-luminous display such as a micro LED television.

According to a second aspect of the present invention, in the encapsulant sheet as described in the first aspect, melt viscosity of the encapsulant sheet measured at a shear rate of $2.43\times10$ $\text{sec}^{-1}$ and measured at a temperature of 120° C. is at least $5.0\times10^4$ poise and no more than $1.0\times10^5$ poise.

According to the second aspect of the present invention, it is possible to maintain the uniformity in film thickness after hot pressing which influences the display quality of images, etc. on the self-luminous display such as a micro LED television, at a higher level than the first aspect of the present invention.

According to a third aspect of the present invention, in the encapsulant sheet as described in the first or second aspect, Vicat softening point is greater than 60° C. and no higher than 100° C.

The third aspect of the present invention sets the Vicat softening point for the encapsulant sheet described in the first or second aspect to a high temperature range differing from a conventional article such as a solar cell module. It is thereby possible to more reliably suppress the occurrence of blocking in the manufacturing process of self-luminous displays made using the encapsulant sheet, and contribute to an improvement in productivity of self-luminous displays. On the other hand, by setting this temperature range to no higher than 100° C., it is possible to sufficiently maintain the molding property on the order demanded in encapsulant sheet for self-luminous displays.

According to a fourth aspect of the present invention, in the encapsulant sheet as described in any one of the first to third aspects, the encapsulant sheet is a resin sheet which is black, white or another color.

The fourth aspect of the present invention establishes the encapsulant sheet for self-luminous displays as described in any one of the first to third aspects as a colored encapsulant sheet. For example, by establishing these encapsulant sheets for self-luminous displays as a colored resin sheet to which a desired color is imparted optically, it is possible to arrange the encapsulant sheet as an optically functional layer that combines an optical characteristic required in the self-luminous display together with the original protective function of light emitting elements of the encapsulant sheet. More specifically, for example, by establishing the encapsulant sheet as described in any one of the first to third aspects as a black resin sheet, for example, since it is possible to form a layer combining the functions of an encapsulant material and a light-shielding layer, it is possible to significantly improve the productivity of self-luminous displays, while achieving the above respective effects possessed by the encapsulant sheet as described in any of the first to third aspects.

According to a fifth aspect of the present invention, in the encapsulant sheet as described in any one of the first to fourth aspects, the encapsulant sheet is a single-layer or a multi-layer resin sheet and the encapsulant sheet includes an adhesive layer exposed at a topmost surface, wherein the adhesive layer contains a resin component and a silane component,
wherein the resin component includes a polyolefin, and
wherein content of the silane component relative to resin component of the adhesive layer is at least 0.02% by mass and no more than 0.15% by mass.

The fifth aspect of the present invention establishes the base resin as a thermoplastic polyolefin in the encapsulant sheet of the first to fourth aspects, and moreover, contains a silane component in a content of a specific range, in a state in which a majority of silane component is graft-polymerized to this polyolefin. It is thereby possible to obtain an encapsulant sheet combining a balance of adhesion durability to a circuit board during use of the self-luminous display which is the final product, and reworkability in a manufacturing stage process. It should be noted that the details of the invention according to the fifth to seventh aspects are explained in the second embodiment.

According to a sixth aspect of the present invention, in the encapsulation sheet as described in the fifth aspect, the silane component includes a graft silane component which graft-polymerizes to the polyolefin of the adhesive layer, wherein the adhesive layer contains at least 70% by mass and no more than 100% by mass of the graft silane component with respect to the silane component.

According to the sixth aspect of the present invention, it is possible to more reliably acquire the above-mentioned effects which can be exerted by the fifth aspect of the present invention, in a product life cycle from manufacture to use of a general micro LED television. In particular, it is possible to significantly improve the stability of the product quality of the encapsulant sheet from manufacturing completion of the encapsulant sheet until incorporated into the final product.

According to a seventh aspect of the present invention, in the encapsulant sheet as described in the fifth or sixth aspect, the encapsulant sheet is a multi-layer resin sheet in which the adhesive layer is laminated on a base layer with polyethylene as a base resin.

According to the seventh aspect of the present invention, the encapsulant sheet as described in the fifth or sixth aspect is established as a resin sheet of multi-layer configuration further including a base layer in addition to the adhesive layer. By configuring the base layer by a resin more superior in heat resistance, it is possible to establish as an encapsulant sheet superior in other physical properties such as heat resistance, while securing each effect which can be exerted by the fifth or sixth aspect of the present invention in the adhesive layer.

According to an eighth aspect of the present invention, in the encapsulant sheet as described in any one of the first to seventh aspects, one surface is an adhesive surface, and the other surface is a peeling surface, adhesive strength of the adhesive surface measured by an adhesion test is at least 5.0 N/15 mm and no more than 50.0 N/15 mm, and adhesive strength of the adhesive surface measured by an adhesion test is at least 0.1 N/15 mm and no more than 3.0 N/15 mm. The adhesion test measures adhesive strength of each surface by adhering a surface on a side serving as a measurement target of an encapsulant sheet sample cut to a width of 15 mm onto a blue-sheet glass plate (75 mm×50 mm×3 mm) and performing lamination processing in a vacuum heated laminator at 140° C. for 10 minutes, and performing a vertical peeling (50 mm/min) test with a peel tester on the encapsulant sheet sample adhered on the blue-sheet glass plate.

In the eighth aspect of the present invention, the encapsulant for self-luminous displays is established as a resin film having an asymmetrical layer configuration of different adhesive strengths, at one surface (adhesive surface) and another surface (peeling surface). It is thereby possible to obtain an encapsulant sheet combining adhesiveness to a circuit board surface having fine unevenness, and mold releasability from a heated plate on which placed during thermal lamination processing, and possible to produce LED modules for self-luminous displays with higher productivity, while keeping quality which is at least equal to conventional, even without using a mold release film. It should be noted that the details of the invention according to the eighth to tenth aspects are explained in the third embodiment.

According to a ninth aspect of the present invention, in the encapsulant sheet as described in the eighth aspect, the encapsulant sheet is a multi-layer resin sheet having an adhesive layer exposed at a surface on a side of the adhesive surface, and a non-adhesive layer exposed at a surface on a side of the peeling surface, the adhesive layer contains a silane component in a proportion of at least 0.02% by mass and no more than 0.19% by mass relative to resin component, and the non-adhesive layer does not contain the silane component, or in a case of containing the silane component, content relative to resin component is less than 0.02% by mass.

According to the ninth aspect of the present invention, a suitable amount of silane component is contained in the adhesive layer forming the adhesive surface, and silane component is either not contained in the non-adhesive layer forming the peeling surface, or even if contained, is limited to less than a very small amount. It is thereby possible to control the adhesive strength of each layer to a favorable range, and more reliably acquire the above effects which can be exerted by the eighth aspect of the present invention.

According to a tenth aspect of the present invention, in the encapsulant sheet as described in the eighth or ninth aspect, the encapsulant sheet is a multi-layer resin sheet in which the adhesive layer is laminated on one surface of the base layer with polyethylene as base resin, and the non-adhesive layer is laminated on the other surface of the base layer.

According to the tenth aspect of the present invention, the encapsulant sheet as described in the eighth or ninth aspect is established as a resin sheet of three-layer configuration made by the adhesive layer and non-adhesive layer respectively being laminated to both surfaces of the base layer. According to this, it is possible to easily produce an encapsulant sheet for which the adhesive strength of each layer is controlled appropriately, by coextruding of resin compositions having respectively different contents of adhesive component, and possible to further establish as an encapsulant sheet superior in productivity, while securing the respective effects which can be exerted by the eighth or ninth aspect of the present invention.

An eleventh aspect of the present invention is a self-luminous display comprising: the encapsulant sheet as described in any one of the first to tenth aspects; a display panel; and a light emitting module in which a plurality of light emitting elements is mounted to a wiring substrate, in which the encapsulant sheet is laminated to the light emitting module to cover the light emitting elements and the wiring substrate, and the display panel is laminated to the encapsulant sheet.

According to the eleventh aspect of the present invention, it is possible to acquire the above respective effects which can be exhibited by the encapsulant sheet of any of the first to tenth aspects, and obtain a self-luminous display superior in optical characteristics, durability and productivity.

According to a twelfth aspect of the present invention, in the self-luminous display as described in the eleventh aspect, the light emitting element is an LED element.

The twelfth aspect of the present invention is an application of the first embodiment to various self-luminous type LED display devices of which a micro LED television expected as mainstream of next generation monitors is representative. It is thereby possible to obtain a self-luminous type LED display device superior in optical characteristics, durability and productivity.

According to a thirteenth aspect of the present invention, in the self-luminous display as described in the twelfth aspect, the LED element has an LED light emitting chip and a resin cover which covers the LED light emitting chip, width and depth of the LED element are both no more than 300 μm, and height is no more than 200 μm, and an arrangement interval of each of the LED elements is at least 0.03 mm and no more than 100 mm.

The thirteenth aspect of the present invention is applying the self-luminous display of the twelfth aspect to a high-definition dot-matrix display device or the like, made by densely mounting LED elements in a chip-on-board format directly mounting many LED chips on the board. It is thereby possible to obtain a high-definition LED display device superior in optical characteristics, durability and productivity.

According to a fourteenth aspect of the present invention, in the self-luminous display as described in the thirteenth aspect, width and depth of the LED element are both no more than 50 μm, and height is no more than 10 μm, and an arrangement interval of each of the LED elements is at least 0.05 mm and no more than 5 mm.

The fourteenth aspect of the present invention is applying the self-luminous display of the thirteenth aspect to a "micro LED television" for which development has advanced in recent years and is expected as a next generation video display device. It is thereby possible to obtain an ultrahigh-definition LED display device superior in optical characteristics, durability and productivity.

According to a fifteenth aspect of the present invention, the self-luminous display as described in any one of the eleventh to fourteenth aspects includes a light emitting surface made by a plurality of the light emitting module being joined on the same plane, wherein the encapsulant sheet is laminated on the light emitting surface.

The fifteenth aspect of the present invention carries out enlargement of the screen size of various self-luminous displays including a micro LED television, by joining a plurality of LED modules for self-luminous displays configured using the encapsulant sheet as described in any one of the eleventh to fourteenth aspects. The encapsulant sheet as described in any one of the eleventh to fourteenth aspects is superior in surface smoothness after joining by thermal lamination; therefore, it is possible to perform screen enlargement of the self-luminous display with a high degree of design freedom, without causing a decline in screen quality accompanying the joining of the above-mentioned modules.

According to the first embodiment, it is possible to provide an encapsulant sheet which is preferable in various self-luminous display applications such as micro LED televisions.

In the self-luminous display, an encapsulant sheet for protecting light emitting elements is laminated on the surface on the light-emitting surface side of an LED module configured by light emitting elements such as LED elements being mounted on a wiring substrate (Patent Document 2).

For the encapsulant sheet for electronic devices disclosed in Patent Document 2, application to various electronic devices including solar cells, etc. has been widely anticipated, and the Vicat softening point thereof is demanded to be in a low temperature range of no higher than 60° C., and more preferably no higher than 30 to 50° C. This is planned as "exhibiting high adhesiveness due to thermocompression in a short time" as disclosed in this document. Furthermore, in the past, even upon ensuring sufficient filling-in property (molding property) of the encapsulant sheet into the unevenness of the surface of electronic devices of various surface forms, it has been considered preferable for the Vicat softening point to be within the above-mentioned low temperature range.

However, in self-luminous displays, a special "uniformity in the film thickness" is required in the encapsulant sheet laminated on the light-emitting surface side of the LED elements. If the film thickness in the central part and the film thickness of the end part of this encapsulant sheet slightly differs, the encapsulant sheet becomes a lenticular state, and will have an untended adverse optical effect on the display quality of the micro LED display device.

In the course of the development of the aforementioned micro LED television, in the case of the surface of an electronic device which is the target of coating by the encapsulant sheet only having minute unevenness as in the light emitting surface of the above-mentioned LED module constituting the micro LED television, for example, and moreover, the uniformity in film thickness of the encapsulant sheet after hot pressing being demanded at a much higher level than the case of a solar cell module or the like in order to maintain video quality, there has come to be doubt in whether the encapsulant sheet having a Vicat softening point in the above such low temperature range can necessarily be considered optimal.

In the production of a self-luminous display, it is not necessary to limit the Vicat softening point to the above such low temperature range (no higher than 60° C.), as in the encapsulant sheet for conventional, common electronic devices. Then, the occurrences of defects unique to the aforementioned self-luminous displays are caused by excessive flow of the resin forming the encapsulant sheet during hot pressing. Consequently, in order to more reliably avoid the occurrence of these defects, after ensuring the required molding property, it is important to reliably suppress excessive flow of the resin forming the encapsulant sheet.

In the case of selecting a resin by focusing on the fluidity during hot pressing, conventionally, the value of MFR is widely adopted as an index thereof. However, although the value of MFR becomes a measurement at 190° C. in the case of measuring based on JIS K6922, this temperature diverges from the temperature upon the encapsulant sheet for self-luminous display actually melting during hot pressing; therefore, the present inventors have come to find a problem in that, even if optimizing the value of MFR, it is not possible to necessarily optimize the behavior of the resin upon hot pressing.

In such a situation, development of an encapsulant sheet specialized as a preferable sheet for various self-luminous display applications such as micro LED televisions for which the expectation as a next generation display device is rising has been desired.

The first embodiment has been made taking account of the above such situation, and has an object of providing an encapsulant sheet superior in fitness for self-luminous displays such as a micro LED television.

The present inventors thoroughly researched, a result of which found that it is possible to use as a sheet preferable in self-luminous display applications, by focusing on the melt viscosity particularly at a temperature of 120° C., and maintaining this at the specific melt viscosity, thereby arriving at completing the first embodiment. Hereinafter, the first embodiment will be explained more specifically.

(Self-Luminous Display)

"Self-luminous display" is a display device for which the micro LED television exemplified above is representative, and is a display device of visual information such as text, images and video. This display device is a display device which can display the above-mentioned visual information directly onto a display screen by mounting a large number of micro light emitting elements in a matrix pattern on a wiring substrate, and flashing each light emitting element by selectively illuminating each light emitting element by way of light emission control means connected thereto.

Figure 3:
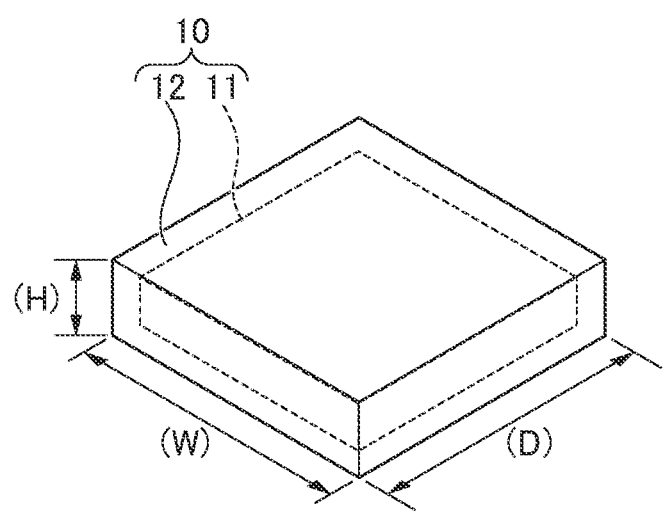
FIG. 3 is a perspective view of an LED element constituting an LED module for the self-luminous displays in FIG. 1.

The encapsulant sheet for self-luminous displays (hereinafter simply referred to as "encapsulant sheet") can be preferably used in LED display devices using LED elements as the light emitting elements, among "self-luminous displays". In addition, the LED elements in this case are more preferably "micro-sized LED elements". In the first embodiment, "micro-sized LED elements" specifically shall refer to an LED element for the size of the overall light emitting element including the LED light emitting chip and a resin cover which coats this, in which the width (W) and depth (D) are both no more than 300 μm, and height (H) is no more than 200 μm (refer to FIG. 3).

Regarding the size of this "micro-sized LED elements", it is more preferable for the width and depth to both be no more than 50 μm, and the height to be no more than 10 μm. It should be noted that this size range is a standard size range of LED elements mounted to a micro LED television for which development has advanced in recent years, and has been anticipated as becoming the main stream of next generation televisions. Hereinafter, in the first embodiment, the self-luminous display in which micro-sized LED elements having width and depth both of no more than 50 μm, and height of no more than 10 μm are arranged in a matrix form at a pitch of several μm to several tens of μm, in a number on the order of at least 1000×1000 is called a "micro LED display device".

Then, a detailed explanation will be made, while adopting an embodiment of a case of the "self-luminous display" below being a "micro LED display device" as a specific preferred example among the various embodiments. However, the technical scope of the present embodiment is not limited to only the application to the "micro LED display device". It is technology which is applicable to all "self-luminous displays" according to the aforementioned definition.

(Micro LED Display Device)

Figure 2:
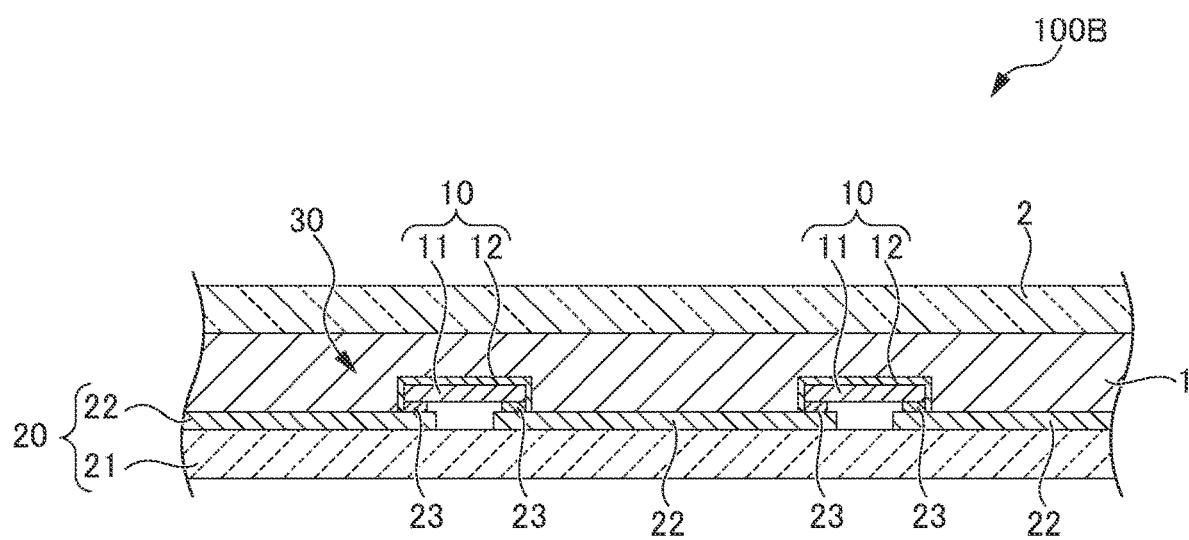
FIG. 2 is a sectional view representing a cross section of the A-A portion in FIG. 1.

FIG. 1 is a front view of a micro LED display device 100 which is an embodiment of the self-luminous display, and a partial enlarged view thereof (100A). In addition, FIG. 2 is a cross-sectional view representing a cross section of the A-A portion in FIG. 1, and is a diagram providing an explanation of the layer configuration of the micro LED display device 100 shown in FIG. 1. This micro LED display device 100 is a self-luminous display device including an "LED module 30" that is a "light emitting module" for a self-luminous display in which a large number of micro-sized "LED elements 10" as "light emitting elements" are mounted to a wiring substrate 20. For each LED element 10, the light emission thereof is controlled independently by a light emission control means (not illustrated) such as an IC chip board separately joined.

In the present embodiment, although the module in which light emitting elements are mounted to a wiring substrate is generally termed as a light emitting module, in the micro LED display device 100, an LED module 30 in which a large number of LED elements 10 are mounted to the wiring substrate 20 corresponds to this light emitting module.

Then, in the micro LED display device 100, the encapsulant sheet 1 for self-luminous display of a second embodiment is laminated in a state coating the LED elements 10 and wiring substrate 20 on the surface on the side of the LED module 30 on which the LED elements 10 are mounted. Then, a display panel 2 such as various optical films and transparent protective glass is further laminated onto an outer surface side of the encapsulant sheet 1 (display surface side of micro LED display device 100).

A plurality of LED modules 30 for self-luminous displays is joined in matrix form on the same plane, and the encapsulant sheet 1 is laminated similarly to as described above on the joined LED modules, whereby it is possible to configure LED modules for large-scale self-luminous displays, and further, large-scale micro LED display devices.

(Production Method of Micro LED Display Device)

The micro LED display device 100 can be produced by making a laminate body which layers the LED module 30 for self-luminous displays in which the LED elements 10 are mounted to the wiring substrate 20, encapsulant sheet 1, display panel 2, and other optical member arranged as necessary, and integrated this laminate body by hot pressing. It should be noted that the part of the laminate member is preferably connected in advance by adhesive before the above-mentioned hot pressing as necessary. The encapsulate sheet 1 of the first embodiment exhibits sufficient molding property during hot pressing for integration as this final product, and is superior in uniformity of film thickness after this hot pressing.

(Led Module)

The LED module 30 which is a light emitting module for self-luminous displays, as shown in FIG. 2, is configured by the LED elements 10 being mounted to a wiring substrate 20 in which wiring 22 is formed in a support substrate 21.

The wiring substrate 20, as shown in FIG. 2, is a circuit board made by the wiring part 22 formed from a metal such as copper and other conductive members being formed, in a form capable of conducting with the LED elements 10, on the surface of the support substrate 21. The support substrate 21 may be a hard substrate such as a conventionally known glass epoxy substrate or glass substrate as the substrate of an electronic circuit, or can be established as a substrate made of resin having flexibility such as polyethylene terephthalate, polyimide or polyethylene naphthalate.

In the LED module 30, as shown in FIG. 2, the LED elements 10 are mounted in a conductive state on the wiring part 22 via a solder layer 23.

Regarding the size of the LED module 30, there is no special limitation; however, that having a diagonal length on the order of 50 to 200 inches is preferable from the viewpoint of cost performance generally. Alternatively, as mentioned above, it is possible to configure the light emitting surface of a self-luminous display such as the large-scale micro LED display device 100, by connecting at plurality of the LED modules 30 for self-luminous displays in a matrix form on the same plane. For example, it is also possible to connect LED modules 30 having a 6 inches diagonal length in 100×100 length/width to configure a micro LED television equipped with a large screen having a diagonal length of 600 inches.

(LED Element)

The LED elements 10 constituting the LED module 30 for self-luminous displays by mounting to a wiring substrate 20 are light emitting elements using the light emission in a PN junction in which a P-type semiconductor and N-type semiconductor are joined. A structure in which a P-type electrode and N-type electrode are provided on the top and bottom surface of the element, and a structure in which both the P-type and N-type electrodes are provided on one element surface have been proposed. LED elements 10 of either structure can be used in the LED display device 100 of the first embodiment; however, it is possible to preferably use a micro-sized LED element such as the LED element disclosed as a "chip-type electronic component" in Japanese Unexamined Patent Application, Publication No. 2006-339551. The LED element disclosed in the same document is said to have a size in width×depth×height of about 25 μm×15 μm×2.5 μm.

The LED element 10 preferably includes an LED light emitting chip 11, and a resin cover 12 which covers this. In addition, as this resin cover 12, an organic insulating material such as epoxy resin, silicon resin and polyimide resin are used, and among these, epoxy resin is preferably used. This is because the resin cover 12 formed by epoxy resin does not only protect simply the LED light emitting chip 11 from physical impact, and also play a role of raising the light emitting efficiency of the LED element 10 by suppressing total reflection of light into the semiconductor caused by the difference in refractive index between air and the semiconductor constituting the LED light emitting chip 11. The encapsulant sheet 1 is preferably established as an encapsulant equipped to the micro LED display device 100, in the point of being formed by polyolefins superior in adherence with the epoxy resin.

In the self-luminous display, it is possible to preferably use LED elements made to include the LED light emitting chip and a resin cover coating this, having a size with the width and depth both being no more than 300 μm, and height no more than 200 μm. In this case, the arrangement interval of these LED elements is preferably at least 0.03 mm and no more than 100 mm.

In the self-luminous display, it is possible to preferably use an LED element made to include the LED light emitting chip and a resin cover coating this, having a very small size with the width and depth both being no more than 50 μm, and height no more than 10 μm. In this case, the arrangement interval of these LED elements is preferably at least 0.03 mm and no more than 100 mm. Such an implementation state of LED elements is a typical implementation state of LED elements in a micro LED television specifically.

(Encapsulant Sheet)

The encapsulant sheet of the first embodiment is a resin sheet which can be preferably used as a resin sheet laminated on the wiring substrate by covering a large number of micro light emitting elements in the "self-luminous display". In addition, this encapsulant sheet is made as a sheet-like member, by forming the encapsulant composition with polyolefin as the base resin. It should be noted that the encapsulant sheet of the first embodiment may be a single layer film; however, it may be a multi-layer film configured by a core layer, and skin layers arranged on both sides of the core layer. It should be noted that the multi-layer film of the first embodiment refers to a film or sheet consisting of a structure having at least any outermost layer, preferably a skin layer molded on both outermost layers, and a core layer that is a layer other than the skin layer.

The thickness of this encapsulant sheet is sufficient so long as being at least 50 μm and no more than 1000 μm, and is preferably at least 50 μm and no more than 500 μm, and more preferably at least 50 μm and no more than 300 μm. In addition, in the case of the LED element which is the target for coating being an LED element of very small size having a height of no more than 10 μm, the thickness of the encapsulant sheet is preferably at least 25 μm and no more than 100 μm. If the thickness of the encapsulant sheet is at least 50 μm, it is possible to sufficiently protect the LED element from external shock. On the other hand, if the thickness of the encapsulant sheet is no more than 1000 µm, it is possible to exhibit sufficient molding property. More specifically, it is possible to perform favorable lamination without gaps by the resin constituting the encapsulant sheet sufficiently wrapping around the unevenness of the LED module surface, during hot pressing in a state covering the LED elements. In the self-luminous display after integration, it is possible to sufficiently ensure the light transmittance of the encapsulating layer consisting of the encapsulant sheet.

Then, in the encapsulant sheet of the first embodiment, the "melt viscosity measured at a temperature of 120° C. at a sheet rate of $2.43 \times 10 \text{ sec}^{-1}$" is at least $5.0 \times 10^3$ poise and no more than $1.0 \times 10^5$ poise, and preferably this melt viscosity is at least $7.0 \times 10^3$ poise and no more than $9.0 \times 10^4$ poise, and more preferably at least $8.0 \times 10^4$ poise and no more than $9.0 \times 10^4$ poise. It should be noted that the above-mentioned melt viscosity of the first embodiment shall refer to the melt viscosity measured by a method based on JIS K7199.

By setting the above-mentioned "melt viscosity" to at least $5.0 \times 10^3$ poise, it is possible to sufficiently suppress squeezing out of resin caused by excessive flow during hot pressing of the encapsulant sheet, or the occurrence of poor luminescence caused by lateral stress to the LED element, and moreover, possible to satisfactorily maintain the uniformity of the film thickness of the encapsulant sheet after the above-mentioned hot pressing. In a self-luminous display such as the micro LED display device 100, a special uniformity in film thickness is demanded in the encapsulant sheet layered on the light emitting side of the LED element. This is because, if the film thickness at the central part of this encapsulant sheet and the film thickness at the end part even slightly differ, the encapsulant sheet becomes a lenticular state, and will have an unintended unpreferable effect on the display quality of the micro LED display device.

On the other hand, by setting the above-mentioned "melt viscosity" to no more than $1.0 \times 10^5$ poise, it is possible to favorably retain the molding property during hot pressing of the encapsulant sheet.

The melt viscosity measured at the temperature of 120° C. at the shear viscosity of $2.43 \times 10 \text{ sec}^{-1}$, for example, can obtain the desired value, by selecting a polyolefin which is the base resin of the resin sheet, or a material other than the base resin contained in the encapsulant composition. As viewpoints upon selecting a polyolefin, for example, it is possible to exemplify the molecular structure, molecular weight and density of the polyolefin. As the molecular structure of the polyolefin, for example, according to the type of olefin and polymerization number, length of the straight chain portion, number and length of branched portions, and type, number and length of side chain portions, it is possible to adjust the value of the above-mentioned "melt viscosity". More specifically, if lengthening the length of the straight chain portion, the value of the "melt viscosity" has a tendency of becoming smaller, and if shortening the length of the straight chain portion, the value of the "melt viscosity" has a tendency of becoming larger. If increasing the number of branched portions, the value of the "melt viscosity" has a tendency of becoming smaller, and if making the number of branched portions smaller, the value of the "melt viscosity" has a tendency of becoming larger. If introducing a polar group to the side chain portion, the value of the "melt viscosity" has a tendency of becoming larger. If making the molecular weight of the polyolefin larger, the value of the "melt viscosity" has a tendency of becoming larger, and if making the molecular weight of the polyolefin smaller, the value of the "melt viscosity" has a tendency of becoming smaller. If making the density of the polyolefin larger, the value of the "melt viscosity" has a tendency of becoming larger, and if making the density of the polyolefin smaller, the value of the "melt viscosity" has a tendency of becoming smaller. As an adjustment by materials other than the base resin contained in the encapsulant composition, for example, a method of adding a resin having different "melt viscosity" than the base resin, or a method of adding an inorganic component such as a filler can be exemplified.

Conventionally, the value of MFR widely adopted as the indicator for the fluidity of the encapsulate sheet is a measurement at 190° C., in the case of measuring based on JIS K6922. However, this temperature diverges from the temperature upon the encapsulant sheet for the self-luminous display actually melting upon hot pressing. As shown in the Examples later, even if the value of the MFR is in the appropriate range of values, in the case of the above-mentioned "melt viscosity" exceeding a predetermined value, the required molding property may not be securable. The reason thereof is surmised as the MFR being an evaluation of the flowability due to static load, and is an index assuming a liquid having low viscosity. By measurement of MFR, it is considered that measurement on the polyolefin at a temperature in the vicinity of 120° C. which is a state having constant viscosity cannot be appropriately performed, or evaluation on the viscosity cannot be appropriately performed. As an index for controlling the fluidity of resin upon hot pressing, in place of MFR, as described above, it is possible to obtain an index related to precise resin selection with high effectiveness, adapted to the mode of use of the encapsulant sheet, by defining the shear modulus at a temperature of 120° C., i.e. melt viscosity at a shear rate of $2.43 \times 10 \text{ sec}^{-1}$ measured at a temperature of 120° C., as described above, as an index for physical property optimization of the encapsulant sheet for self-luminous displays.

The melt viscosity measures the viscosity while melting. Since there is concern over the encapsulant sheet for self-luminous displays, when performing hot pressing at a high temperature such that greatly exceeds 120° C., damaging the LED module, it is used at a temperature in the vicinity of 120° C. The polyolefin has a constant viscosity at a temperature in the vicinity of 120° C. For the encapsulant sheet for self-luminous displays, since it is required to fill gaps between small LED elements, it is considered important to focus on the viscosity of the encapsulant sheet.

The encapsulant sheet of the first embodiment has a Vicat softening point preferably exceeding 60° C. and no more than 100° C., and more preferably at least 70° C. and no more than 90° C. By letting the Vicat softening point of the encapsulant sheet exceed 60° C., it is possible to more reliably suppress the occurrence of blocking in the manufacturing process of the self-luminous display using the encapsulant sheet, and contributes to an increase in the productivity of the self-luminous display. On the other hand, by setting the Vicat softening point to no more than 100° C., it is possible to sufficiently maintain the molding property on the order required in the encapsulant sheet for self-luminous displays.

Regarding the aforementioned Vicat softening point of the encapsulant sheet of the first embodiment, in more detail, it is preferable to more rigorously optimize according to the melting point of this encapsulant sheet. More specifically, in the case of the melting point of the encapsulant sheet being in a relatively low range of at least 50° C. and less than 70° C., in order to suppress excessive flow during hot pressing, it is preferable to set the Vicat softening point as a range of at least 60° C. and less than 70° C. In addition, a case of this melting point being in a relatively high range of at least 70° C. favorably maintains the molding property during hot pressing; therefore, it is preferable to set the Vicat softening point as a range of at least 70° C. and no more than 100° C. It should be noted that the "Vicat softening point" of the encapsulant sheet of the first embodiment shall be considered a value obtained by measuring, based on ASTM D1525, the Vicat softening point at a stage after sheet formation completion of the encapsulant sheet made by sheet forming the encapsulant composition containing resin component and other additives by a molding method such as melt extrusion molding.

From another viewpoint, the encapsulant sheet of the first embodiment preferably has a Durometer A hardness of at least 60 and less than 95. If the Durometer A hardness of the encapsulant sheet is less than 60, the crystallization rate of the polyolefin slows, and the sheet drawn from the extruder is sticky. Peeling of the cooling roller thereby becomes difficult, and obtaining the encapsulant sheet becomes difficult. In addition, due to sticking to the encapsulant sheet occurring, blocking and feeding of the sheet become difficult. On the other hand, if the Durometer A hardness exceeds 95, the molding property declines, and the following nature to the unevenness of the LED elements becomes insufficient.

The base resin of the encapsulant composition constituting the encapsulant sheet can be widely selected from thermoplastic polyolefins, so long as the "melt viscosity measured at a temperature of 120° C. at a sheet rate of $2.43 \times 10 \text{ sec}^{-1}$" is in the above-mentioned range. Thereamong, it is possible to preferably use a polyethylene such as low-density polyethylene (LDPE), linear low-density polyethylene (LLDPE), or metallocene linear low-density polyethylene (M-LLDPE). It should be noted that "base resin" in the first embodiment shall refer to a resin, in a resin composition containing this base resin, having the largest content ratio among the resin component of this resin composition.

The density of the above-mentioned polyethylene used as the base resin in the encapsulant composition is sufficient so long as at least 0.870 g/cm$^3$ and no more than 0.910 g/cm$^3$, and is preferably at least 0.895 g/cm$^3$ and no more than 0.905 g/cm$^3$. By setting the density of the base resin of the encapsulant composition to no more than 0.910 g/cm$^3$, it is possible to maintain the adherence to the wiring substrate of the encapsulant sheet in a preferable range. In addition, by setting this density to at least 0.890 g/cm$^3$, it is possible to impart sufficient heat resistance required to the encapsulant sheet without subjecting to a cross-linking treatment.

It is more preferable to contain a fixed amount in each encapsulant composition, as necessary, a silane copolymer (hereinafter referred to as silane-modified polyethylene) made by copolymerizing ethylene, ethylenically unsaturated silane compound as a comonomer, in the encapsulant composition. The silane-modified polyethylene, for example, is made by graft-polymerizing with the ethylenically unsaturated silane compound as a side chain to the linear low-density polyethylene (LLDPE) serving as the main chain. Such a graft copolymer, due to the degree of freedom of the silanol group contributing to the adhesive strength becoming higher, can improve the adhesiveness of the encapsulant sheet 1 to other members in a self-luminous display such as the micro LED display device 100. The content in the encapsulant composition of this silane-modified polyethylene, for example, if a case of a multi-layer encapsulant sheet consisting of a configuration of skin layer-core layer-skin layer, is preferably at least 2% by mass and no more than 20% by mass in the encapsulant composition for the core layer, and at least 5% by mass and no more than 40% by mass in the encapsulant composition for the skin layers. At least 10% of the silane-modified polyethylene is more preferably contained in the encapsulant composition for the skin layers. It should be noted that the silane modification amount in the above-mentioned silane-modified polyethylene is preferably on the order of at least 1.0% by mass and no more than 3.0% by mass. The preferred content range of the silane-modified polyethylene in the above-mentioned encapsulant composition is premised on the above-mentioned silane modification amount being within this range, and it is desired to appropriately fine tune according to the fluctuation in this modification amount.

By using the silane-modified polyethylene as a component of the encapsulant composition for self-luminous displays, it is possible to produce a self-luminous display superior in strength, durability, etc., and superior in weather resistance, heat resistance, water resistance, light resistance, wind pressure resistance, hail resistance, and other properties, and further having superior heat fusion without being influenced by the production conditions such as thermal pressure bonding to produce the self-luminous display, and suited to various applications stably and at low cost.

Second Embodiment Encompassed by Present Embodiment

More specifically, the second embodiment provides the following.

A sixteenth aspect of the present invention is an encapsulant sheet for a self-luminous display or for a direct backlight which is a single-layer or a multi-layer resin sheet that includes an adhesive layer exposed on a topmost surface, in which the adhesive layer contains a resin component and a silane component, in which the resin component includes a polyolefin, in which content of the silane component relative to resin component of the adhesive layer is at least 0.02% by mass and no more than 0.15% by mass.

The sixteenth aspect of the present invention establishes the base resin in the encapsulant sheet encapsulating an electronic device having a fine unevenness as a thermoplastic polyolefin, and moreover, contains the silane component in a state in which the majority of the silane component is graft-polymerized to this polyolefin in a specific range of content. It is thereby possible to obtain an encapsulant sheet combining a balance of adhesion durability to a circuit board during use of the micro LED television, etc. which is the final product, and reworkability in a manufacturing stage process.

According to a seventeenth aspect of the present invention, in the encapsulant sheet as described in the sixteenth aspect, the polyolefin is a polyethylene having a density of at least 0.870 g/cm$^3$ and no more than 0.910 g/cm$^3$.

According to the seventeenth aspect of the present invention, it is possible to establish an encapsulant sheet having favorable adhesiveness and heat resistance.

According to an eighteenth aspect of the present invention, the silane component includes a graft silane component which graft-polymerizes to the polyolefin of the adhesive layer, in which the adhesive layer contains at least 70% by mass and no more than 100% by mass of the graft silane component with respect to the silane component.

According to the eighteenth aspect of the present invention, it is possible to more reliably acquire the above-mentioned effects which can be exerted by the invention of the sixteenth or seventeenth aspect, in a product life cycle from manufacture to use of a general micro LED television.

In particular, it is possible to significantly improve the stability of the product quality of the encapsulant sheet from manufacturing completion of the encapsulant sheet until incorporated into the final product.

According to a nineteenth aspect of the present invention, in the encapsulant sheet as described in any one of the sixteenth to eighteenth aspects, the encapsulant sheet is a multi-layer resin sheet in which the adhesive layer is laminated to a base layer with polyethylene as a base resin.

According to the nineteenth aspect of the present invention, the encapsulant sheet as described in any one of the sixteenth to eighteenth aspects is established as a resin sheet of multi-layer configuration further including a base layer in addition to the adhesive layer. By configuring the base layer by a resin more superior in heat resistance, it is possible to establish as an encapsulant sheet superior in other physical properties such as heat resistance, while securing each effect which can be exerted by any one of the sixteenth to eighteenth aspects of the present invention in the adhesive layer.

A twentieth aspect of the present invention is a production method of an encapsulant sheet for a self-luminous display or a direct backlight, in which the encapsulant sheet is a single-layer or a multi-layer resin sheet configured to contain an adhesive layer exposed at a topmost surface, the method comprising: an adhesive layer forming step of forming the adhesive layer by melt forming an encapsulant composition for adhesive layer, in which the encapsulant composition for adhesive layer contains polyolefin and a silane component, and is free of cross-linking agent, at least 70% by mass and no more than 100% by mass of silane component among the silane component is a graft silane component which is graft-polymerizing to the polyolefin, and content of the silane component relative to the polyolefin is adjusted so that a first adhesive strength measured by a first adhesion test of the adhesive layer is at least 3.0 N/15 mm and no more than 8.0 N/15 mm, and a second adhesive strength measured by a second adhesion test of the adhesive layer is at least 10.0 N/15 mm and no more than 20.0 N/15 mm. The first adhesion test measures the first adhesive strength by adhering an encapsulant sheet sample cut to a width of 15 mm onto a glass epoxy plate (75 mm×50 mm×0.05 mm) and performing lamination processing in a vacuum heated laminator at 140° C. for 10 minutes, and performing a vertical peeling (50 mm/min) test with a peel tester on the encapsulant sheet sample adhered on the glass epoxy plate. The second adhesion test measures the second adhesive strength by adhering an encapsulant sheet sample cut to a width of 15 mm onto a glass epoxy plate (75 mm×50 mm×0.05 mm) and performing lamination processing in a vacuum heated laminator at 140° C. for 10 minutes, thereafter further performing curing processing in a vacuum heated laminator at 150° C. for 15 minutes, and performing a vertical peeling (50 mm/min) test with a peel tester on the encapsulant sheet sample adhered on the glass epoxy plate.

The twentieth aspect of the present invention defines the technical concept according to the sixteenth aspect of the present invention as a production method. This production method is a method of establishing the base resin in the encapsulant sheet encapsulating an electronic device as a thermoplastic polyolefin, and moreover, using component in which the majority of the silane component is graft-polymerized to the polyolefin, and then optimizing the content of silane component so that the adhesiveness in a plurality of stages at the manufacturing stage can be optimized. It is thereby possible to obtain an encapsulant sheet combining a balance of adhesion durability to a circuit board during use of the micro LED television, etc. which is the final product, and reworkability in a manufacturing stage process.

A twenty-first aspect of the present invention is a self-luminous display comprising: the encapsulant sheet as described in any one of the sixteenth to nineteenth aspects; a display panel; and a light emitting module in which a plurality of light emitting elements are mounted to a wiring substrate, in which the encapsulant sheet is laminated to the light emitting module to cover the light emitting elements and the wiring substrate, and the display panel is laminated to the encapsulant sheet.

The twenty-first aspect of the present invention is an application of the second embodiment to various LED display devices of which a micro LED television expected as mainstream of next generation monitors is representative. It is thereby possible to obtain an LED display device superior in productivity and durability.

According to a twenty-second aspect of the present invention, in the self-luminous display as described in the twenty-first aspect, the light emitting element is an LED element, the LED element has an LED light emitting chip and a resin cover which covers the LED light emitting chip, width and depth of the LED element are both no more than 300 μm, and height is no more than 200 μm, and an arrangement interval of each of the LED elements is at least 0.03 mm and no more than 100 mm.

The twenty-second aspect of the present invention is applying the self-luminous display of the twenty-first aspect to a high-definition dot-matrix display device or the like, made by densely mounting LED elements in a chip-on-board format directly mounting many LED chips on the board. It is thereby possible to obtain a high-definition LED display device superior in productivity and durability.

According to a twenty-third aspect of the present invention, in the self-luminous display as described in the twenty-second aspect, width and depth of the LED element are both no more than 50 μm, and height is no more than 10 μm, and an arrangement interval of each of the LED elements is at least 0.05 mm and no more than 5 mm.

The twenty-third aspect of the present invention is applying the self-luminous display of the twenty-second aspect to a "micro LED television" for which development has advanced in recent years and is expected as a next generation video display device. It is thereby possible to obtain an ultrahigh-definition LED display device superior in productivity and durability.

A twenty-fourth aspect of the present invention is a reworking method of the self-luminous display as described in any one of the twenty-first to twenty-third aspects, the method comprising: sequentially performing a thermal lamination step divided into two stages of processing of an initial lamination processing and final curing processing to integrate a laminate body including a light emitting module and an encapsulant sheet laminated to cover light emitting elements configuring the light emitting module; and performing a reworking step accompanying an operation to cut out a part of the encapsulant sheet and peel from the light emitting module, after completion of the initial lamination processing and before start of the final curing processing.

The twenty-fourth aspect of the present invention can achieve at preferable levels both adhesion durability during long term use as a self-luminous display such as a micro LED television, and reworkability in the manufacturing stage process, for an LED module for self-luminous displays configured using the encapsulant sheet as described in the sixteenth aspect, for example.

According to the second embodiment, it is possible to provide an encapsulant sheet for self-luminous displays which possesses both adhesion durability during long term use as a self-luminous display such as a micro LED television, and reworkability in the production stage.

In the self-luminous display, an encapsulant sheet for protecting the light emitting element is laminated on the surface on the light emitting side of the LED module (light emitting module) configured by light emitting elements such as LED elements being mounted to a wiring substrate (refer to Patent Documents 2 and 3). The encapsulant containing the polyethylene is disclosed in Patent Document 2, and an encapsulant containing an acid-modified polyethylene which is more superior in glass adhesion is disclosed in Patent Document 3.

The adhesion durability over a long term with the circuit board consisting of glass epoxy resin, glass plate or the like, after integration as the aforementioned micro LED television or the like is demanded in the encapsulant sheet for self-luminous displays during use thereof. However, on the other hand, for example, in the above-mentioned micro LED television, although several tens of thousands to several hundreds of thousands of LED elements are mounted per one unit, it is virtually impossible to completely prevent, at the initial stage of mounting, poor light emission of all of these LED elements. Based on this, "reworkability" in a state laminated and integrated to the circuit board on which LED elements are mounted is also demanded in the encapsulant sheet for self-luminous displays.

It should be noted that "rework" in the second embodiment shall refer to an operation of cutting part of the encapsulant sheet without damaging normal LED elements, peeling off from the circuit board, and replacing only part of the defective elements among the LED elements mounted to the circuit board. In addition, "reworkability" shall refer to the compliance of the above-mentioned operation of "rework" of the encapsulant sheet, i.e. appropriate peeling ease during this operation.

The second embodiment has been made taking account of the above such situation, and has an object of providing an encapsulant sheet for self-luminous displays which possesses both adhesion durability during long term use as a self-luminous display such as a micro LED television, and reworkability in the production stage.

The present inventors thoroughly researched, a result of which found that the above-mentioned problem could be solved by optimizing the silane component graft-polymerized to the polyolefin in an encapsulant sheet for electronic devices which is a resin sheet with a thermoplastic polyolefin as the base resin, thereby arriving at completing the second embodiment. Hereinafter, a second embodiment will be explained more specifically.

It should be noted that, due to being shared with the first embodiment, explanations of the self-luminous display, micro LED display device, LED module and LED element will be omitted.

(Encapsulant Sheet)

The encapsulant sheet of the second embodiment is a resin sheet which can preferably be used as a resin sheet laminated on the wiring substrate by covering the light emitting elements in a "self-luminous display", etc. on which a large number of micro light emitting elements, such as micro LED television, and is a resin sheet superior in reworkability.

The encapsulant sheet of the second embodiment is a sheet made as a member of sheet form, by forming the encapsulant composition with polyolefin as the base resin into a film. Then, in this sheet-like state, it is a single-layer or a multi-layer resin sheet configured to contain an adhesive layer exposed on the topmost surface. In other words, the encapsulant sheet of the second embodiment may be a single layer sheet consisting of only the adhesive layer explained in detail below. Alternatively, the encapsulant sheet of the second embodiment may be a multi-layer sheet made by an adhesive layer and another resin layer having a different resin density and composition than the adhesive layer being laminated. It should be noted that the multi-layer film of the second embodiment refers to a film or sheet consisting of a structure having an adhesive layer formed on at least either outermost layer, preferably both outermost layers, and a base layer which is a layer other than the adhesive layer.

In the case of the encapsulant sheet of the second embodiment being a multi-layer sheet, it is possible to exemplify a layer configuration made by an adhesive layer containing a silane component consisting of polyolefin on at least one surface, preferably both surfaces, of the base layer consisting of polyolefin as a preferred example of the layer configuration, for example. In this case, as the polyolefin constituting the base layer, it is preferable to select a resin more superior in heat resistance than the polyolefin constituting the adhesive layer.

Either way, with the encapsulant sheet of the second embodiment, even in a case of being any layer configuration other than the layer configuration exemplified in the above description, it is made an essential requirement for the layer of the topmost surface exposed on at least one surface of the resin sheet to be the aforementioned adhesive layer.

In the case of the encapsulant sheet of the second embodiment being a resin sheet of a single layer consisting of only the adhesive layer, the total thickness thereof may be at least 50 µm and no more than 1000 µm, is preferably at least 50 µm and no more than 500 µm, and more preferably at least 50 µm and no more than 300 µm. In addition, in the case of the encapsulant sheet 1 being a multi-layer resin sheet of three layers of two types consisting of a base layer and adhesive layers laminated on both sides thereof, the total thickness thereof is preferably at least 70 µm and no more than 500 µm, and the thickness of the adhesive layer in this case is preferably at least 10 µm and no more than 100 µm, and the thickness of the base layer is preferably at least 50 µm and no more than 300 µm.

However, in the case of the LED element which is the target for coating being a very small-sized LED element having a height no more than 10 µm, even in the case of the total thickness of the encapsulant sheet being any layer configuration, it is preferable for the total thickness to be at least 25 µm and no more than 100 µm, and in the case of being a multi-layer sheet of three layers of two types, the thickness of an adhesive layer within the above-mentioned total thickness layer is preferably at least 5 µm and no more than 30 µm.

Depending on the size of the LED element which is the coating target, by the total thickness of the encapsulant sheet being at least 50 µm, or at least 5 µm, it is possible to sufficiently protect the LED element from external impact. On the other hand, if the thickness of the encapsulant sheet is no more than 1000 µm, it will tend to exhibit a molding property during hot pressing in the thermal laminating process. More specifically, during the hot pressing in the state of coating the LED element, it tends to carry out favorable lamination without gaps by the resin constituting the encapsulant sheet sufficiently wrapping around the surface irregularities of the LED module surface. In addition, in the case of the LED element which is the target of coating being a very small-sized LED element having a height no more than 10 μm, if the thickness of the encapsulant sheet is no more than 100 μm, in the self-luminous display after integration, the light transmittance of the encapsulation layer consisting of the encapsulant sheet tends to be maintained at a favorable level.

In the second embodiment, as the polyolefin establishing the adhesive layer of the encapsulant sheet of a single layer or an encapsulant sheet of multiple layers, the polyolefin can preferably use a polyolefin having a density of at least 0.870 g/cm$^3$ and no more than 0.910 g/cm$^3$. In addition, it is possible to more preferably use a low-density polyethylene having a density of at least 0.895 g/cm$^3$ and no more than 0.905 g/cm$^3$. By setting the density of the base resin which is the adhesive layer as no more than 0.910 g/cm$^3$, it is possible to maintain the adhesiveness to the wiring substrate, etc. of the encapsulant sheet to the preferred range. In addition, by setting this density as at least 0.870 g/cm$^3$ a, it is possible to impart the heat resistance required in the encapsulant sheet without subjecting to a cross-linking treatment. It should be noted that "base resin" in the second embodiment shall refer to a resin, in a resin composition containing this base resin, having the largest content ratio among the resin component of this resin composition.

As the above-mentioned polyethylene serving as the base resin of the encapsulant composition for the adhesive layer, in more detail, it is possible to preferably use low-density polyethylene (LDPE), linear low-density polyethylene (LLDPE) or metallocene linear low-density polyethylene (M-LLDPE). Thereamong, M-LLDPE which is synthesized using metallocene catalyst which is a single-site catalyst has few branches of side chains, and uniform distribution of comonomer; therefore, by the molecular weight distribution being narrow, and being easy to make ultra-low density, it is possible to establish the adhesiveness of the encapsulant sheet 1 relative to the wiring substrate 20 consisting of glass epoxy resin plate, glass plate or the like in the self-luminous display such as the micro LED display device 100 to be more superior.

Then, in the adhesive layer constituting the encapsulant sheet, a silane component is contained within a specific content range in the polyolefin which is the base resin, and preferably in the aforementioned polyethylene. The content of "silane component" in the resin component of the adhesive layer is sufficient so long as at least 0.02% by mass and no more than 0.15% by mass, and is preferably at least 0.03% by mass and no more than 0.10% by mass. If the amount of silane component in the resin component of the adhesive layer is 0.02% by mass, the initial adhesiveness in the production process of integration of the self-luminous display tends to be insufficient. On the other hand, in the case of this amount exceeding no more than 0.15% by mass, the reworkability of this production process will be insufficient. In addition, in this case, deterioration of the silane component during storage tends to occur, and there is also a tendency of the tensile strength of the encapsulant sheet and the heat fusion declining.

In the encapsulant sheet of the second embodiment, the majority of this "silane component" contained in the adhesive sheet, i.e. at least 70% by mass and no more than 100% by mass of silane component in this silane component, is a "graft silane component" which is graft-polymerizing to the polyolefin that is the base resin, and the proportion of "unreacted silane component" not graft-polymerizing to the same base resin in this silane component is preferably no more than 30% by mass. By the proportion of "graft silane component" in the silane component being at least 70% by mass, i.e. the above proportion of "unreacted silane component" being no more than 30% by mass, it is possible to lengthen the use expiration date (shelf life) of the encapsulant sheet for self-luminous displays. More specifically, in the case of the above proportion of this "unreacted silane component" exceeding 30% by mass, the use expiration date (shelf life) upon storing in an environment at 23° C. and 50%, i.e. the period for which the adhesiveness retention rate between the encapsulant sheet and glass epoxy substrate immediately after film formation is at least 80%, is on the order of 3 to 6 months; whereas, by suppressing this proportion to less than 30% by mass, it becomes possible to make this period 12 to 18 months.

Herein, "silane component" in the second embodiment shall refer to "alkoxysilane grafted to main chain of base resin and alkoxysilane not grafted". In addition, "graft silane component" in the second embodiment shall refer to "alkoxysilane component graft-polymerizing to the base resin", and "unreacted graft component" which is another silane component shall refer to "free alkoxysilane component not grafted to base resin".

It should be noted that, regarding the content (% by mass") of the "graft silane component" of the encapsulant sheet, it is possible to measure the content thereof by quantifying the Si atomic weight in ICP emission spectral analysis or EPMA, and qualifying the alkoxysilanes grafted by gas chromatography. It should be noted that the "unreacted silane component", i.e. free alkoxysilane component in the base resin, for example, can be extracted by immersing in a solvent such as toluene, and after extraction, it is possible to quantify similarly by the above respective analysis methods, other than ICP emission spectral analysis.

As the material of the "graft silane component" in the adhesive layer, it is possible to use a silane-modified polyolefin, and preferably to use a silane-modified polyethylene. This silane-modified polyethylene is made by graft-polymerizing an ethylenically unsaturated silane compound as a side chain to a linear low-density polyethylene (LLDPE), etc. serving as the main chain, for example. Such a graft copolymer has a higher degree of freedom of the silanol groups contributing to the adhesive strength. It is thereby possible to improve the adhesiveness and adhesion durability of the glass epoxy substrate, etc. which is the encapsulant sheet 1 to the wiring substrate 20. The silane-modified polyethylene can be produced by the method disclosed in Japanese Unexamined Patent Application, Publication No. 2003-46105, for example.

As the resin material forming the adhesive layer, in the case of using this silane-modified polyethylene, the graft amount of ethylenically unsaturated silane compound of this silane-modified polyethylene, and the added amount of this silane-modified polyethylene relative to the total resin component of the adhesive layer may be appropriately adjusted so that the amount of silane compound in the resin component of the adhesive layer becomes in the aforementioned range of at least 0.02% by mass and no more than 0.15% by mass.

Adjustment of this graft amount and added amount are as described below in detail. In the case of obtaining silane-modified polyethylene by graft-polymerizing vinyl trimethoxysilane, which is ethylenically unsaturated silane compound, with the base resin such as a linear low-density polyethylene (LLDPE), since the molecular weight of vinyl trimethoxysilane is 148.2; whereas, the molecular weight of Si is 28.1, the proportion of Si in vinyl trimethoxysilane is on the order of 19.0%, whereby the silane component amount among the 5.0 parts by mass of the vinyl trimethoxysilane is on the order of 0.95 parts by mass, for example. In addition, since the silane components volatilizing into the atmosphere during the course of production of the encapsulant sheet are abundant, in the case adding 5.0 parts by mass of vinyl trimethoxysilane, the silane component finally remaining in the resin component of the encapsulant sheet becomes on the order of 0.4 parts by mass generally. It should be noted that, by using silane-modified polyethylene without separate addition such as a silane coupling agent, it is possible to set approximately 80% to 99% as the graft silane component in the overall silane component in the resin. Regarding the graft amount of the silane component and added amount of polymerized resin during production of the aforementioned silane-modified polyethylene, based on the above items as general references, it is preferable to optimize the final formulation according to the conditions of each manufacturing site.

The MFR of the polyolefin serving as the base resin of the adhesive layer is preferably at least 5 g/10 min and no more than 35 g/10 min. By the MFR being in the range of at least 5 g/10 min and no more than 35 g/10 min, it is possible to improve the initial adhesiveness and adhesion durability with balance. It should be noted that the melt mass flow rate (MFR) of the second embodiment, unless otherwise noted, shall refer to the value of the melt mass flow rate (MFR) at 190° C., load of 2.16 kg measured according to JIS K6922-2, as mentioned above.

Figure 4:
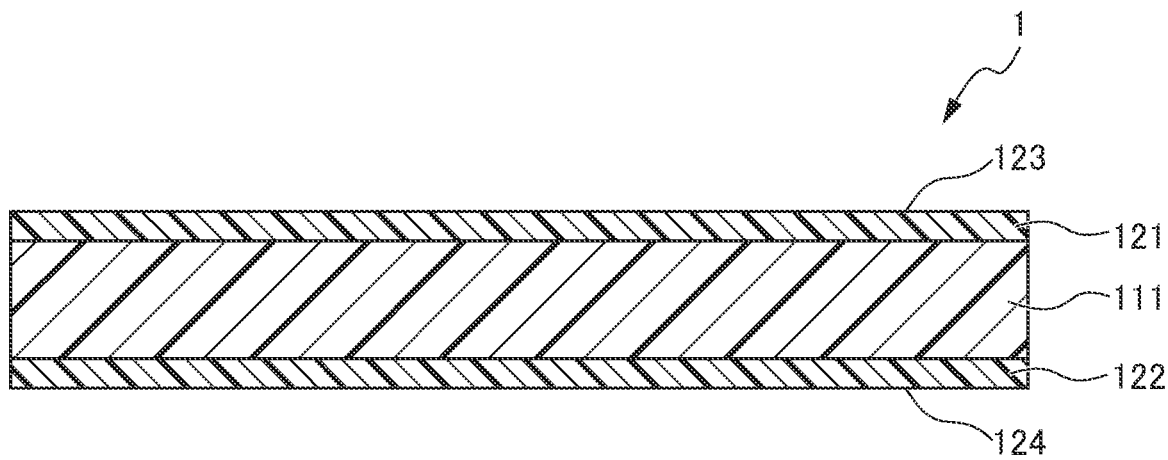
FIG. 4 is a sectional view which schematically shows an example of a layer configuration of an encapsulant sheet of a third embodiment.

For example, as in the encapsulant sheet 1 shown in FIG. 4, in the case of the encapsulant sheet in the second embodiment being a multi-layer sheet, although it is preferable for the base resin of the base layer to use the same polyolefin as the adhesive layer, it is preferable to select a resin which is more superior in heat resistance than the polyolefin constituting the adhesive layer. More specifically, it is preferable to use a polyethylene having a density of at least 0.890 g/cm$^3$ and no more than 0.925 g/cm$^3$, and it is more preferable to use a polyethylene having a density of at least 0.895 g/cm$^3$ and no more than 0.920 g/cm$^3$. By setting the density of the base resin of the base layer as no more than 0.920 g/cm$^3$, it is possible to retain the adhesiveness of the encapsulant sheet to the wiring substrate or the like within the preferred range. In addition, by setting this density as at least 0.895 g/cm$^3$, it is possible to impart the heat resistance required in the encapsulant sheet 1, without subjecting to a cross-linking treatment.

In the encapsulant sheet 1 which is a multi-layer sheet, it is more preferable to use a polyethylene or other polyolefin having a melting point on the order of at least 80° C. and no more than 125° C. as the base layer, and higher melting point than the silane-modified polyolefin forming the adhesive layer. In this case, by configuring the multi-layer sheet by combining a resin of silane-modified polyethylene base of low melting point having a melting point on the order of 60 to 100° C. as the silane-modified polyolefin forming the adhesive layer, it is possible to establish an encapsulant sheet superior in balance of the heat resistance and adhesiveness, and adhesion durability.

In the encapsulant sheet 1 which is a multi-layer sheet, the containing a silane component in the base layer is not essential. However, in the resin component of the base layer, it may be contained in a proportion no more than 0.06% by mass. In addition, at least 70% of the silane component among all silane components in this case is preferably the aforementioned "graft silane component".

The encapsulant sheet of the second embodiment explained above is a thermoplastic resin sheet with the aforementioned polyolefin as the base resin, and not containing a crosslinker. In addition, the gel fraction of this encapsulant sheet is 0%. It should be noted that "gel fraction (%) in the second embodiment is a value obtained by placing 1.0 g of encapsulant sheet on a resin mesh, extracting for 12 hours in xylene 110° C., followed by removing the entire resin mesh and weighing before and after a drying process, carrying out a mass comparison from before and after extraction to measure the mass % of residual insoluble fraction, and defining this as the gel fraction. It should be noted that gel fraction 0% refers to a state in which the above-mentioned residual insoluble fraction is substantially 0, and the crosslinking reaction of the encapsulant composition or encapsulant sheet has not substantially started. More specifically, "gel fraction 0%" shall refer to a case of the above-mentioned residual insoluble fraction being entirely nonexistent, and a case of the mass % of the above-mentioned residual insoluble fraction measured by precision balance being less than 0.05% by mass. It should be noted that a pigment component, etc. other than resin component shall not be contained in the above-mentioned residual insoluble fraction. In the case of contaminants other than these resin components mixing with the residual insoluble fraction by the above tests, for example, by separately measuring the content in the resin component of these contaminants in advance, it is possible to calculate the gel fraction which should be originally obtained for the residual insoluble fraction derived from the resin component excluding these contaminants.

(Production Method of Encapsulant Sheet)

The encapsulant sheet of the second embodiment can be produced by subjecting the encapsulant composition for forming each layer at least including the adhesive layer for which the composition details were described above, to the film formation step of melt forming into a sheet form. This melt formation can be carried out by a formation method normally used for usual thermoplastic resins, i.e. various formation methods such as injection molding, extrusion molding, vacuum molding, compression molding and rotary molding. As the formation method of a multi-layer sheet, as one example, a molding method by coextrusion by at least two types of melt kneading extruders, or a method of joining by dry laminating after film forming separately each layer can be exemplified.

It should be noted that in the encapsulant sheet of the second embodiment, a crosslinker is often not contained in the encapsulant composition. For this reason, under the usual molding temperature of low-density polyolefin, for example, heating conditions at around 120° C., a change in gel fraction is not realized, and the gel fraction of the encapsulant composition during film production is maintained at 0%. Consequently, it is possible to reduce the load acting on the extruder or the like during film production, and raise the productivity of the encapsulant sheet.

In particular, in the adhesive layer forming step of forming the adhesive layer using the encapsulant composition for the adhesive layer, the content of silane component in the polyolefin as the base resin of the encapsulant composition for the adhesive layer is found to preferably be in the range of at least 0.02% by mass and no more than 0.15% by mass; however, it is more preferable to obtain a test film forming step which determines an optimal value for the optimal content of silane component relative to the polyolefin, so that the first adhesive strength measured by the following first adhesion test of the adhesive layer becomes at least 3.0 N/15 mm and no more than 8.0 N/15 mm, and the second adhesive strength measured by the following second adhesion test of the adhesive layer becomes at least 10.0 N/15 mm and no more than 20.0 N/15 mm. For example, the measurement result of each of the above-mentioned adhesive strengths of the sample encapsulant sheet obtained in this test film production step is fed back to the adjustment of the silane component amount in the adhesive layer, a result of which it is possible to favorably retain the reworkability of the encapsulant sheet, by continuing production using the encapsulant composition of the same composition.

(First Adhesion Test):

Lamination processing was performed in a vacuum heated laminator at 140° C. for 10 minutes by adhering the encapsulant sheet sample cut to the size of 75×50 mm on a glass epoxy plate (75 mm×50 mm×0.05 mm), and in a state penetrating to immediately above the glass epoxy plate surface with 15 mm width in the encapsulant sheet sample adhered on the glass epoxy plate, making a cut serving as the start for the peeling start location, and then performing a vertical peeling (50 mm/min) test with a peel testing machine (Tensilon universal testing machine RTF-1150-H) to measure a first adhesive strength.

(Second Adhesion Test)

Lamination processing was performed in a vacuum heated laminator at 140° C. for 10 minutes by adhering the encapsulant sheet sample cut to the size of 75×50 mm on a glass epoxy plate (75 mm×50 mm×0.05 mm), and subsequently, curing processing was further performed in the vacuum heated laminator at 150° C. for 15 minutes, and in a state penetrating to immediately above the glass epoxy plate surface with 15 mm width in the encapsulant sheet sample adhered on the glass epoxy plate, making a cut serving as the start for the peeling start location, and then performing a vertical peeling (50 mm/min) test with a peel testing machine (Tensilon universal testing machine RTF-1150-H) to measure a second adhesive strength.

(Production Method of Micro LED Display Device)

The micro LED display device 100 can be obtained by subjecting to a step establishing a laminate body made by laminating the LED module 30 for self-luminous displays made by LED elements 10 being mounted on the wiring substrate 20, the encapsulant sheet 1, and another optical member arranged as necessary, and integrating this laminate body by hot pressing, and subsequently, further laminating and integrating the display panel 2 to this laminate by adhering, pasting, or the like.

The above-mentioned thermal lamination process is preferably divided into the two stages processing of an initial lamination processing and final curing processing, which are sequentially performed. This is because, by performing the thermal lamination process by dividing into the initial lamination processing of causing the encapsulant sheet to follow the uneven surface of the LED without producing bubbles, and adhering, and the final curing processing of further increasing the adhesion after adhering to make an article with stable adhesion, it becomes possible to produce encapsulant of micro LEDs of stronger adhesion under high quality stability.

As necessary, part of the laminated members may be joined by adhesive in advance before the above-mentioned thermal lamination process. The encapsulant sheet 1 of the second embodiment is characterized in the point of being a sheet which, during hot pressing in the thermal lamination process for integration as this final product, exhibits sufficient molding property to impart reworkability contributing to a productivity improvement, and superior in adhesion durability after this thermal lamination process.

(Reworking Method of Micro LED Display Device)

Upon performing the production method of the above-mentioned micro LED display device, it is possible to perform the reworking step of cutting part of the encapsulant sheet 1 and peeling off from the LED module after completion of the above-mentioned initial lamination processing and before start of the final curing processing, and then replacing LED elements causing light emission deficiency, with ease. As mentioned above, this is because the encapsulant sheet 1 is a sheet which realizes adhesion of a reworkable extent based on the above-mentioned first adhesive strength after completion of the initial lamination processing, and realizes favorable adhesion durability based on the above-mentioned second adhesive strength after completion of the final curing processing.

Third Embodiment Encompassed by Present Embodiment

More specifically, the third embodiment provides the following.

A twenty-fifth aspect of the present invention is an encapsulant sheet for a self-luminous display or a direct backlight, in which one surface is an adhesive surface, and the other surface is a peeling surface, adhesive strength of the adhesive surface measured by an adhesion test is at least 5.0 N/15 mm and no more than 50.0 N/15 mm, and adhesive strength of the peeling surface is at least 0.1 N/15 mm and no more than 3.0 N/15 mm. The adhesion test measures adhesive strength of each surface by adhering a surface on a side serving as a measurement target of an encapsulant sheet sample cut to a width of 15 mm onto a blue-sheet glass plate (75 mm×50 mm×3 mm) and performing laminate treatment in a vacuum heated laminator at 140° C. for 10 minutes, and performing a vertical peeling (50 mm/min) test with a peel tester on the encapsulant sheet sample adhered on the blue-sheet glass plate.

In the twenty-fifth aspect of the present invention, the encapsulant for self-luminous displays is established as a resin film having an asymmetrical layer configuration of different adhesive strengths, at one surface (adhesive surface) and another surface (peeling surface). It is thereby possible to obtain an encapsulant sheet combining adhesiveness to the circuit board surface having fine unevenness, and releasability from a heated plate on which placed during thermal lamination processing, and possible to produce LED modules for self-luminous displays with higher productivity, while keeping quality which is at least equal to conventional, even without using a mold release film.

According to the twenty-sixth aspect of the present invention, in the encapsulant sheet as described in the twenty-fifth aspect, a polyethylene having a density of at least 0.870 g/cm$^3$ and no more than 0.930 g/cm$^3$ is the base resin.

According to the twenty-sixth aspect of the present invention, it is possible to optimize the balance between adhesiveness and mold releasability of the encapsulant sheet.

According to a twenty-seventh aspect of the present invention, in the encapsulant sheet as described in the twenty-fifth or twenty-sixth aspect, the encapsulant sheet is a multi-layer resin sheet having an adhesive layer exposed at a surface on a side of the adhesive surface, and a non-adhesive layer exposed at a surface on a side of the peeling surface, the adhesive layer contains a silane component in a proportion of at least 0.02% by mass and no more than 0.19% by mass relative to resin component, and the non-adhesive layer does not contain the silane component, or even in a case of containing silane component, content thereof relative to resin component is less than 0.02% by mass.

According to the twenty-seventh aspect of the present invention, a suitable amount of silane component is contained in the adhesive layer forming the adhesive surface, and silane component is either not contained in the non-adhesive layer forming the peeling surface, or even if contained, is limited to less than a very small amount. It is thereby possible to control the adhesive strength of each layer to a favorable range, and more reliably acquire the above effects which can be exerted by the twenty-fifth or twenty-sixth aspect of the present invention.

According to a twenty-eighth aspect of the present invention, in the encapsulant sheet as described in any one of the twenty-fifth to twenty-seventh aspect, the encapsulant sheet is a multi-layer resin sheet in which the adhesive layer is laminated on one surface of a base layer with polyethylene as a base resin, and the non-adhesive layer is laminated on the other surface thereof.

According to the twenty-eighth aspect of the present invention, the encapsulant sheet as described in any one of the twenty-fifth to twenty-seventh aspects is established as a resin sheet of three-layer configuration made by the adhesive layer and non-adhesive layer respectively being laminated to both surfaces of the base layer. According to this, it is possible to easily produce an encapsulant sheet for which the adhesive strength of each layer is controlled appropriately, by coextruding of resin compositions having respectively different contents of adhesive component, and possible to further establish as an encapsulant sheet superior in productivity, while securing the respective effects which can be exerted by the any one of the twenty-fifth to twenty-seventh aspects of the present invention.

A twenty-ninth aspect of the present invention is an LED module for self-luminous display comprising: the encapsulant sheet as described in any one of the twenty-fifth to twenty-eighth aspects; a light emitting module in which a plurality of light emitting elements is mounted on a wiring substrate, in which the encapsulant sheet is laminated to the light emitting module in a state opposing the adhesive surface against the light emitting element and the wiring substrate.

The twenty-ninth aspect of the present invention is applied to an "LED module" which can be preferably used in order to configure a self-luminous display such as a "micro LED television" for which development has advanced in recent years and is expected as a next generation video display device. It is thereby possible to establish a module superior in productivity and durability of a self-luminous display made using this.

A thirtieth aspect of the present invention is a self-luminous display comprising: the LED module for self-luminous displays as described in the twenty-ninth aspect; and a display panel, in which the display panel is laminated to the peeling surface of the encapsulant sheet configuring the LED module.

The thirtieth aspect of the present invention is applying the LED module of the twenty-ninth aspect to the self-luminous display such as a "micro LED television" for which development has advanced in recent years and is expected as a next generation video display device. It is thereby possible to obtain an LED display device superior in productivity and durability.

A thirty-first aspect of the present invention is a product method of the LED module for self-luminous displays as described in the twenty-ninth aspect, comprising: a thermal lamination step of integrating a laminate body in which the light emitting module and the encapsulant sheet are laminated, by thermal press bonding in a state placing on a heated plate including metal and/or glass, in which the thermal press bonding is performed by directly placing the peeling surface of the encapsulant sheet configuring the laminate body on the heated plate, without going through a mold release film.

The thirty-first aspect of the present invention defines the technical concept according to the twenty-fifth aspect of the present invention as a production method. This production method can produce the LED module for self-luminous displays with higher productivity, while keeping quality which is at least equal to conventional, even without using a mold release film, by using the encapsulant sheet combining adhesiveness to the circuit board surface having fine unevenness, and mold releasability from a heated plate on which placed during thermal lamination processing.

According to the third embodiment, it is possible to provide an encapsulant sheet for self-luminous displays which can produce an LED module for self-luminous displays with higher productivity, while keeping quality at least equal to conventional, even without using a mold release film.

The self-luminous display is a configuration in which a display panel such as various optical films or transparent protective glass is laminated on an LED module for self-luminous displays made by an encapsulant sheet for protecting light emitting elements being laminated on the surface of a light emitting side of the light emitting module in which the light emitting elements such as LED elements are mounted to a wiring substrate (refer to Patent Documents 2 and 3).

In the encapsulant sheet for forming the aforementioned LED module for self-luminous displays, for example, it has been demanded to be superior in adhesiveness between the glass epoxy resin, the glass plate or the like constituting the substrate of the aforementioned LED module and. As an example of such an encapsulant sheet superior in adhesiveness, an encapsulant material made to contain polyethylene is disclosed in Patent Document 2, and an encapsulant material made to contain an acid-modified polyethylene which is more superior in glass adhesiveness is disclosed in Patent Document 3.

However, the LED module for self-luminous displays is produced by a thermal lamination process which integrates a laminate body made by a light emitting module and encapsulant sheet being laminated, and thermal press bonds this in a state placed on a heated plate. In this process, in order to secure sufficient releasability required after completion of the above-mentioned process between the encapsulant sheet having superior adhesiveness and the above-mentioned heated plate, it has been necessary to interpose various mold release films consisting of polyester resin or the like between the encapsulant sheet and the heated plate, upon performing the above-mentioned thermal press bonding.

However, when performing the above-mentioned thermal lamination process by interposing a mold release film, not only does the consumption cost of the mold release film accumulate, there have been cases where the smoothness of the encapsulant sheet surface is impaired, due to fine unevenness in the surface of the mold release film, deformation accompanying heating, etc. Loss in smoothness of the encapsulant sheet surface is linked to a decline in the optical properties of the self-luminous display or long term durability. At the production site of LED modules for self-luminous displays, the development of a technical means which can avoid a quality decline and deterioration in productivity accompanying the use of a mold release film has been demanded.

The third embodiment has been made taking account of the above such situation, and has an object of providing an encapsulant sheet for self-luminous displays which enables to produce LED modules for self-luminous displays at higher productivity, while keeping quality at least equal to conventional, even without using a mold release film.

The present inventors thoroughly researched, a result of which found that the above-mentioned problem could be solved by an encapsulant sheet having asymmetrical adhesiveness on both sheet surfaces, for an encapsulant sheet for self-luminous displays, thereby arriving at completing the third embodiment. Hereinafter, the third embodiment will be explained more specifically.

It should be noted that, due to being shared with the first embodiment, explanations of the self-luminous display, micro LED display device, LED module and LED element will be omitted.

(Encapsulant Sheet)

The encapsulant sheet of the third embodiment is a resin sheet which can preferably be used as a resin sheet laminated on the wiring substrate by covering the light emitting elements in a "self-luminous display", etc. on which a large number of micro light emitting elements, such as micro LED television, and is a resin sheet superior in reworkability.

The encapsulant sheet of the third embodiment which can be preferably used for a self-luminous display is a resin sheet which can be preferably used as the resin sheet covering light emitting elements and laminating on a wiring substrate, by having favorable molding property on one surface of an LED module on which a large number of micro light emitting elements are mounted. Then, moreover, this encapsulant sheet is a resin sheet which makes the use of a release film upon thermal lamination processing unnecessary, while maintaining at least equal quality of LED module, by having a suitable mold releasability on the other surface, thereby being able to contribute to an improvement in productivity of LED modules and self-luminous display made using this.

The encapsulant sheet of the third embodiment, for example, is made as a sheet-like member, by film forming an encapsulant composition with a polyethylene having a density of at least 0.870 g/cm$^3$ and no more than 0.930 g/cm$^3$ as the base resin. Then, in the sheet-like state, it is a resin sheet with the main feature of the adhesive strength being prepared in different ranges between one surface (adhesive surface) and the other surface (peeling surface). It should be noted that the "base resin" in the third embodiment shall refer to a resin, in a resin composition containing this base resin, having the largest content ratio among the resin component of this resin composition.

In this way, in an orthogonal direction relative to the sheet surface, so long as being a resin sheet having an asymmetrical structure as explained in detail below regarding adhesiveness, this layer configuration is not limited to a specific configuration. The encapsulant sheet may be a resin sheet of substantially single-layer structure, in which adhesive component is unevenly distributed to the adhesive surface side, or a surface treatment to improve the adhesiveness or mold releasability is conducted on only one surface. Alternatively, it may be a two-layer configuration made by laminating an adhesive layer having adhesiveness to one side of the base layer having mold releasability, or a three-layer configuration made by laminating the adhesive layer on one surface of the base layer and forming a special non-adhesive layer on the other surface, as in the encapsulant sheet (encapsulant sheet 1) shown in FIG. 4.

Even in the case of the encapsulant sheet of the third embodiment being any of the above-mentioned layer configurations, for the adhesive strength of each surface of the encapsulant sheet, it is sufficient so long as the respective strengths measured by the "adhesion test" described in the next paragraph are respectively within predetermined ranges. More specifically, it is sufficient so long as the adhesive strength of the adhesive surface is at least 5.0 N/15 mm and no more than 50.0 N/15 mm, and is more preferably at least 5.0 N/15 mm and no more than 12.0 N/15 mm. In addition, it is sufficient so long as the adhesive strength of the peeling surface is at least 0.1 N/15 mm and no more than 3.0 N/15 mm, and is more preferably at least 0.3 N/15 mm and no more than 2.0 N/15 mm.

(Adhesion Test)

Adhesion Test: Adhesive strength of each surface is measured by adhering a surface on a side serving as a measurement target of an encapsulant sheet sample cut to a width of 15 mm onto a blue-sheet glass plate (75 mm×50 mm×3 mm) and performing lamination processing in a vacuum heated laminator at 140° C. for 10 minutes, and performing a vertical peeling (50 mm/min) test with a peel tester (Tensilon universal testing machine RTF-1150-H) on the encapsulant sheet sample adhered on the blue-sheet glass plate.

In the encapsulant sheet 1 defined above, if the adhesive strength of the adhesive surface 124 is less than 5.0 N/15 mm, the initial adhesiveness in the manufacturing process of integration as an LED Module tends to be insufficient. On the other hand, in the case of this adhesive strength exceeding 50.0 N/15 mm, the elongation in tension of the encapsulant sheet, and thermal bonding tend to decline. In addition, by limiting the adhesive strength of the adhesive surface 124 at no more than 12.0 N/15 mm, it is possible to secure the reworkability of the encapsulant sheet 1. Herein, "rework" in the third embodiment shall refer to an operation of cutting part of the encapsulant sheet from the LED module without damaging normal LED elements, peeling off from the circuit board, and replacing only part of the defective elements among the LED elements mounted to the circuit board. In addition, "reworkability" shall refer to the compliance of the above-mentioned operation of "rework" of the encapsulant sheet, i.e. appropriate peeling ease during this operation.

The encapsulant sheet of the third embodiment is preferably a resin sheet (encapsulant sheet 1) of three-layer configuration such as that shown in FIG. 4, as mentioned above. The encapsulant sheet 1 of FIG. 4 is a resin sheet of three-layer configuration in which an adhesive layer 122 is laminated on one surface of a base layer 111 with polyethylene as the base resin, and a non-adhesive layer 121 is laminated on the other surface thereof. In the encapsulant sheet 1 of this three-layer configuration, the surface of the non-adhesive layer 121 which is one outermost layer constitutes the peeling surface which is superior in mold releasability from heated plates (41, 42) of the laminator, and the surface of the adhesive layer 122 which is the other outermost layer constitutes the adhesive surface 124 superior in molding property and adhesiveness.

In the case of the encapsulant sheet 1 being a multi-layer resin sheet of three-layer configuration consisting of the base layer 111, the adhesive layer 122 and non-adhesive layer 121 laminated on both sides thereof, the total thickness thereof is preferably at least 70 μm and no more than 500 μm, and the thickness of the base layer 111 in this case is preferably at least 50 μm and no more than 300 μm, and the thickness of the adhesive layer 122 is preferably at least 10 μm and no more than 100 μm in order to realize favorable molding property. The thickness of the non-adhesive layer 121 is sufficient so long as on the order of at least 5 μm and no more than 30 μm; however, it is preferably set as a thickness of the same order as the adhesive layer 122. This is because, when establishing the encapsulant sheet as a multi-layer resin sheet of the aforementioned such three-layer configuration, in the case of forming with resins having greatly different melting points and densities in the adhesive layer 122 and non-adhesive layer 121 laminated on both surfaces thereof, curl deformation tends to occur in the manufacturing process, and there is a risk of the ease in handling of the encapsulant sheet declining.

However, in the case of the LED element which is the target for coating being a very small-sized LED element having a height no more than 10 μm, for the total thickness of the encapsulant sheet of the third embodiment, even in the case of being any layer configuration, the total thickness is preferably at least 25 μm and no more than 100 μm, and in the case of being a multi-layer sheet of three layers as in the encapsulant sheet 1 shown in FIG. 4, the thickness of an adhesive layer 122 within the above-mentioned total thickness layer is preferably at least 5 μm and no more than 30 μm. In addition, the thickness of the non-adhesive layer 121 is sufficient so long as on the order of at least 5 μm and no more than 30 μm; however, it is preferably set as a thickness of the same order as the adhesive layer 122 for the same reason as described above.

In the third embodiment, depending on the size of the LED element which is the coating target, by the total thickness of the encapsulant sheet being at least 50 μm, or at least 5 μm, it is possible to sufficiently protect the LED element from external impact. On the other hand, if the thickness of the encapsulant sheet is no more than 1000 μm, it will tend to exhibit a molding property in the thermal lamination process. More specifically, during the hot pressing in a state coating the LED elements, it tends to carry out favorable lamination without gaps by the resin constituting the encapsulant sheet sufficiently wrapping around the surface irregularities of the surface of the wiring substrate on which LED elements are mounted. In addition, in the case of the LED elements which are the target of coating being very small-sized LED elements having a height no more than 10 μm, if the thickness of the encapsulant sheet is no more than 100 μm, the light transmittance of the encapsulating layer consisting of the encapsulant sheet tends to be maintained at a favorable level in the self-luminous display after integration.

As the base resin of the resin composition forming the encapsulant sheet of the third embodiment, for example, it is possible to use polyolefin, and preferable to use a polyethylene having a density of at least 0.870 g/cm³ and no more than 0.930 g/cm³. It should be noted that, in the case of the encapsulant sheet being formed by a plurality of resin layers of different densities, it is sufficient if the density of the resin layer which has the lowest density is at least 0.870 g/cm³, and the density of the resin layer which has the highest density is no more than 0.930 g/cm³.

In the encapsulant sheet 1 which is a multi-layer sheet of three-layer configuration, it is preferable to establish the base resin of the base layer 111 as a resin more superior in heat resistance than the base resin of the adhesive layer 122. More specifically, as the base resin of the base layer 111, it is preferable to use a polyethylene having a density of at least 0.890 g/cm³ and no more than 0.925 g/cm³, and more preferable to use a polyethylene having a density of at least 0.895 g/cm³ and no more than 0.920 g/cm³. By setting the density of the base resin of the base layer 111 as no more than 0.925 g/cm³, it is possible to maintain the adhesiveness to the wiring substrate or the like of the encapsulant sheet in a preferred range. In addition, by setting this density to at least 0.890 g/cm³, it is possible to impart the heat resistance required in the encapsulant sheet 1, without subjecting to cross-linking treatment.

In the encapsulant sheet 1 which is a multi-layer sheet of three-layer configuration, the base resin of the adhesive layer 122 preferably uses a polyethylene having a density of at least 0.870 g/cm³ and no more than 0.920 g/cm³, and more preferable uses a polyethylene having a density of at least 0.895 g/cm³ and no more than 0.915 g/cm³. In this case, by setting the density of the base resin of the adhesive layer 122 as no more than 0.920 g/cm³, it is possible to maintain the adhesiveness to the wiring substrate or the like of the encapsulant sheet 1 in a preferred range. In addition, by setting this density to at least 0.870 g/cm³, it is possible to impart the heat resistance required in the encapsulant sheet 1, without subjecting to cross-linking treatment.

In the encapsulant sheet 1 which is a multi-layer sheet of three-layer configuration, the base resin of the non-adhesive layer 121 preferably uses a polyethylene having a density of at least 0.890 g/cm³ and no more than 0.930 g/cm³, and more preferable uses a polyethylene having a density of at least 0.900 g/cm³ and no more than 0.925 g/cm³. In this case, by setting the density of the base resin of the non-adhesive layer 121 as no more than 0.930 g/cm³, it is possible to impart minimal adhesiveness in a range not inhibiting the mold releasability required in the encapsulant sheet 1. In addition, by setting this density to at least 0.890 g/cm³, it is possible to maintain the mold releasability of the encapsulant sheet 1 at a preferable level.

As the base resin of the encapsulant composition for each layer forming the encapsulant sheet of the third embodiment, in more detail, it is possible to preferably use low-density polyethylene (LDPE), linear low-density polyethylene (LLDPE) or metallocene linear low-density polyethylene (M-LLDPE). Thereamong, M-LLDPE which is synthesized using metallocene catalyst which is a single-site catalyst has few branches of side chains, and uniform distribution of comonomer; therefore, by the molecular weight distribution being narrow, and being easy to make ultra-low density, it is possible to establish the adhesiveness of the encapsulant sheet relative to the wiring substrate 20 consisting of glass epoxy resin plate, glass plate or the like in the LED module 30, and the self-luminous display such as the micro LED display device 100 to be more superior.

Among the respective layers configuring the encapsulant sheet of the third embodiment, the silane component in the adhesive layer 122 is preferably contained within a specific content range. The content of the "silane component" in the resin component of the adhesive layer 122 is preferably at least 0.02% by mass and no more than 0.19% by mass, and more preferably at least 0.02% by mass and no more than 0.15% by mass. If the content of the silane component in the resin component of the adhesive layer is less than 0.02% by mass, the initial adhesiveness in the manufacturing process of integrating as the LED module tends to be insufficient. On the other hand, in the case of the content of the silane component exceeding 0.19% by mass, relative to the increase in silane component, the adhesive strength hardly increases more than this, and the tendency strengthens for the burden of material cost becoming more apparent. In addition, in this case, deterioration of the silane component during storage tends to occur, and there is also a tendency of the tensile strength of the encapsulant sheet and the heat fusion declining. In addition, by limiting the content of silane component in the resin component of the adhesive layer to no more than 0.15% by mass, it is possible to secure the reworkability of the encapsulant sheet.

On the other hand, among the respective layers configuring the encapsulant sheet of the third embodiment, it is preferable for silane component not to be contained in the non-adhesive layer 121 in order to maintain the mold releasability suited to the peeling surface. In addition, even if silane component is contained, the content thereof is preferably less than 0.02% by mass in the resin component of the non-adhesive layer 121.

In the encapsulant sheet 1 which is a multi-layer sheet of three-layer configuration, containing a silane component in the base layer 111 is optional, and may be contained in a proportion no more than 0.06% by mass in the resin component of the base layer 111. However, for example, in the case of one surface of the base layer 111 being exposed at the topmost surface of the encapsulant sheet 1 as the outermost layer, and forming the peeling surface by this surface, as in the case of the aforementioned resin sheet of two-layer configuration, it is preferable for silane component not to be contained in the base layer 111, and even if silane component is contained, the content thereof is preferably less than 0.02% by mass.

It should be noted that, in the encapsulant sheet of the third embodiment, the majority of this "silane component" contained in the adhesive sheet, i.e. at least 70% by mass and no more than 100% by mass of silane component in this silane component, is a "graft silane component" which is graft-polymerizing to the polyolefin that is the base resin, and the proportion of "unreacted silane component" not graft-polymerizing to the same base resin in this silane component is preferably no more than 30% by mass. By the proportion of "graft silane component" in the silane component being at least 70% by mass, i.e. the above proportion of "unreacted silane component" being no more than 30% by mass, it is possible to lengthen the use expiration date (shelf life) of the encapsulant sheet for self-luminous displays. More specifically, in the case of the above proportion of this "unreacted silane component" exceeding 30% by mass, (shelf life) upon storing in an environment at 23° C. and 50%, i.e. the period for which the adhesiveness retention rate between the encapsulant sheet and glass epoxy substrate immediately after film formation is at least 80%, is on the order of 3 to 6 months; whereas, by suppressing this proportion to less than 30% by mass, it becomes possible to make this period (shelf life) 12 to 18 months.

It should be noted that "silane component", "graft silane component" and "unreacted silane component" explanations in the third embodiment are shared with the explanations of "silane component in the second embodiment, and thus are omitted.

(Production Method of Encapsulant Sheet)

The encapsulant sheet of the third embodiment can be produced by subjecting the encapsulant composition for forming each layer for which the composition details were described above, to the film formation step of melt forming into sheet form. This melt formation can be carried out by a formation method normally used for usual thermoplastic resins, i.e. various formation methods such as injection molding, extrusion molding, vacuum molding, compression molding and rotary molding. As the formation method of a multi-layer sheet, as one example, a molding method by coextrusion by at least two types of melt kneading extruders, or a method of joining by dry laminating after film forming separately each layer can be exemplified.

For example, the content of silane component in the polyolefin as the base resin of the encapsulant composition for the adhesive layer is found to preferably be within the range of at least 0.02% by mass and no more than 0.19% by mass; however, it is possible to stably acquire the effects of the third embodiment by performing trial film formation in advance, performing final adjustment by determining the optimal value for the content of silane component in the encapsulant composition from the measurement results of the adhesive strength of each layer of the sample encapsulant sheet thereby obtained, and subsequently continuing production using encapsulant compositions of the same composition.

(Production Method of LED Module for Self-Luminous Displays)

The LED module 30 for self-luminous displays constituting the micro LED display device 100 can be obtained by subjecting to a thermal lamination process of making a laminate body by laminating the wiring substrate 20 on which the LED elements 10 are mounted, and the encapsulant sheet 1, and integrating by thermal press bonding in a state placing this laminate body on a heated plate.

Figure 5:
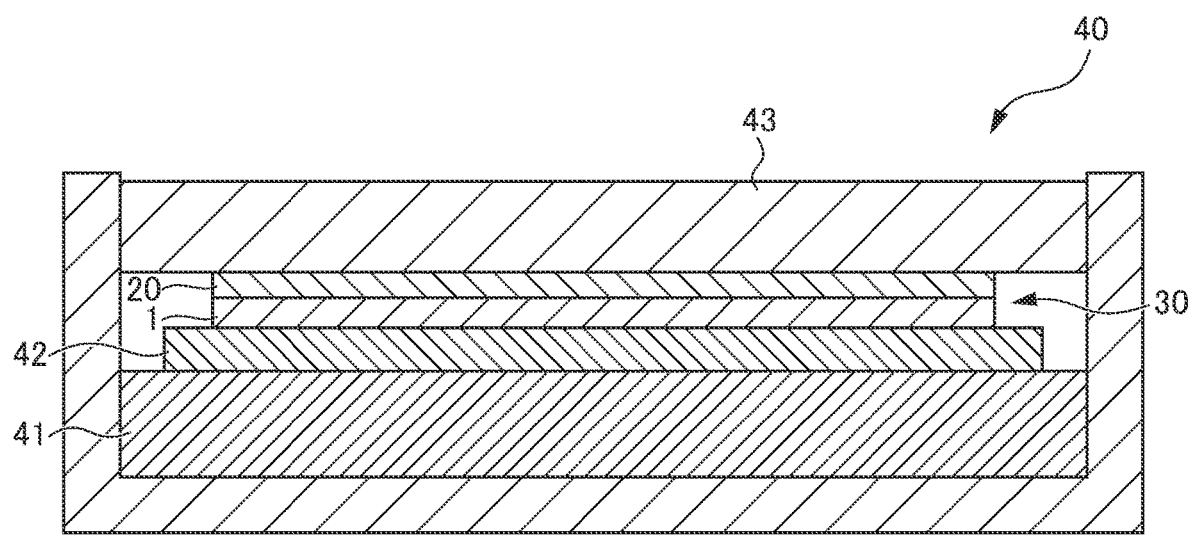
FIG. 5 is a diagram presenting an explanation of a production method of LED modules for a self-luminous display made using the encapsulant sheet of the third embodiment.
Figure 6:
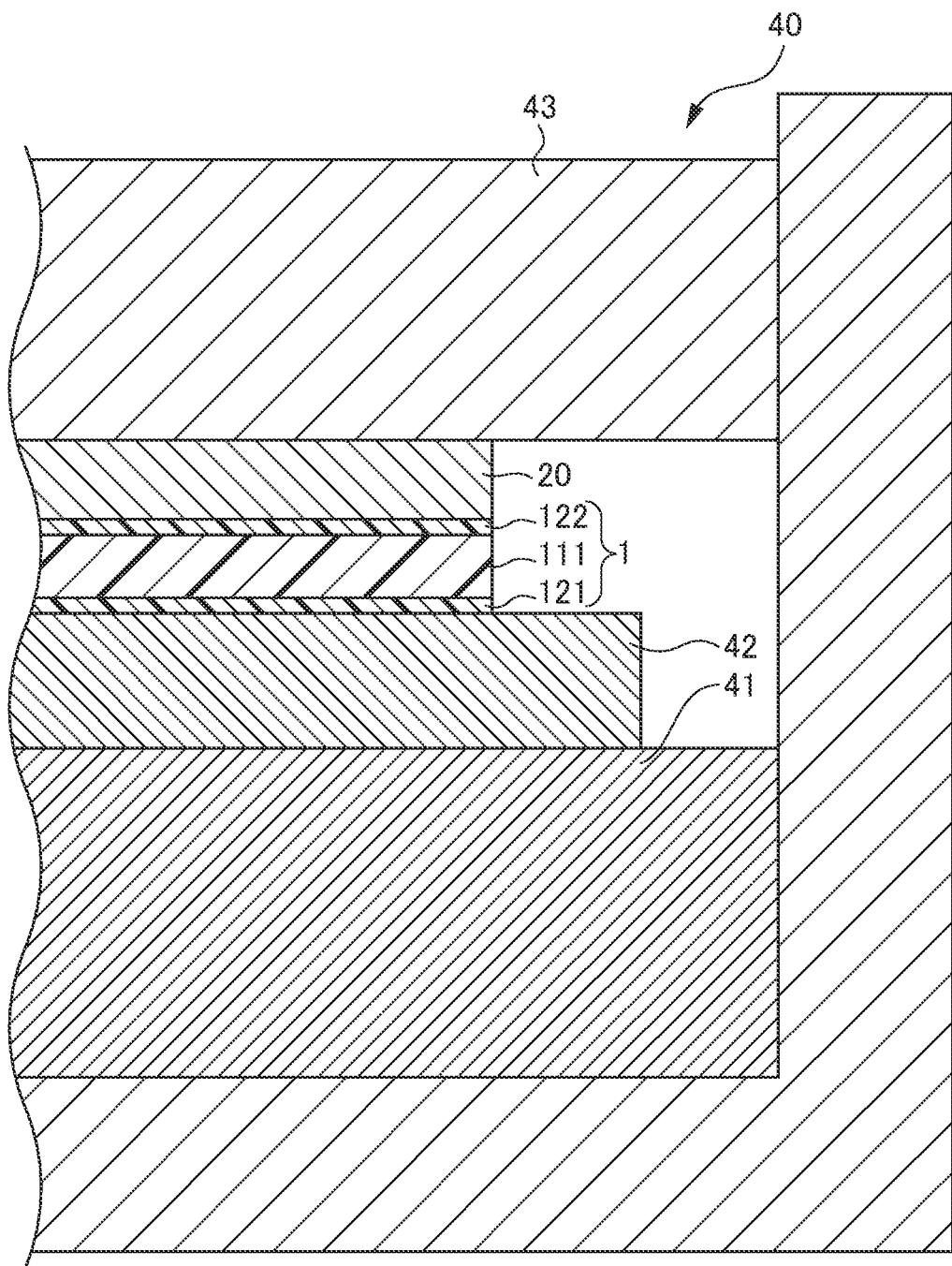
FIG. 6 is a diagram which is a partially enlarged view of FIG. 5, presenting an explanation of an aspect of placement of the encapsulant sheet, relative to a heated plate of a laminator.

As shown in FIG. 5, this thermal lamination process can be performed by placing the above-mentioned laminate body on the heated plate 41 of the laminator 40 on the side of the encapsulant sheet 1 either directly or via an auxiliary heated plate 42, and pressure bonding a laminate body holding plate 43 by vacuum drawing in this state to the laminate body. It should be noted that the auxiliary heated plate 42 is an auxiliary member arranged for compensating for a deficiency in smoothness of the surface of the heated plate 41 consisting of an iron plate or the like, and usually, a glass plate such as blue-sheet glass having thermal conductivity and surface smoothness is used. The "heated plate" of the third embodiment is not limited to one configured from only the heated plate 41. In the case of the auxiliary heated plate 42 being laminated on the heated plate 41, the laminated body consisting of both is considered as the "heated plate".

Conventionally, in the case of placing the laminate body configuring the LED module 30 for self-luminous displays on the heated plate 41 (42) in a state facing the encapsulant sheet, it has been necessary to interpose a mold release film between the encapsulant sheet and heated plate 41 (42) in order to allow release while maintaining the smoothness of the encapsulant sheet surface after heating. In contrast, by establishing the encapsulant sheet as the encapsulant sheet 1 of the third embodiment having a different layer configuration than the conventional article, it is possible to place this laminate body directly on the heated plate 41 (42) of the laminator 40 and integrate without going through a mold release film, during thermal press bonding of the above-mentioned laminate body.

Placement of the above-mentioned laminate body on this heated plate 41 (42) is carried out by directly placing the peeling surface 123 of the encapsulant sheet on the heated plate 41 (42) without going through a mold release film. So long as being the encapsulant sheet 1 of three-layer configuration consisting of the adhesive layer 122, base layer 111 and non-adhesive layer 121, it will create a laminate body configuring the LED module 30 for self-luminous displays so that the surface of the non-adhesive layer 121 serving as the peeling surface 123 of the encapsulant sheet 1 is exposed at the topmost surface. Then, as shown in FIG.

6, thermal pressure bonding is performed in a state directly placing the surface of this non-adhesive layer 121 on the heated plate 41 (42). It should be noted that, at this time, in the adhesive surface 124 consisting of the adhesive layer 122 of the encapsulant sheet 1, the resin forming the encapsulant sheet exhibits sufficient molding property, and adheres with favorable adhesive strength to the wiring substrate 20 on which the LED elements 10 are mounted.

It should be noted that, normally, with a conventional, general mold release film, since the adhesive material is assumed as the adherend, the smoothness of the surface of this film is often deficient in the smoothness demanded in the surface of the encapsulant sheet for self-luminous displays. By using the encapsulant sheet of the third embodiment, since it is possible to perform the thermal lamination process by excluding a conventional, general mold release film, for example, by using the auxiliary heated plate 42 made of glass which is superior in surface smoothness as the auxiliary heated plate 42, it is possible to avoid this problem, and stably keep the surface smoothness of the encapsulant sheet at a high level.

It should be noted that the above-mentioned thermal lamination process is preferably sequentially performed by dividing into the two stages processing of an initial lamination processing and final curing processing. This is because, by performing the thermal lamination process by dividing into the initial lamination processing of causing the encapsulant sheet to follow the uneven surface of the wiring substrate on which the LED elements are mounted without producing bubbles, and adhering, and the final curing processing of further increasing the adhesion after adhering to make an article with stable adhesion, it becomes possible to produce the LED module 30 for self-luminous displays under higher quality and stability.

(Production Method of Self-Luminous Display)

By further laminating and integrating the display panel 2 by adhering, sticking or the like to the LED module 30 which can be obtained by the above-mentioned production method, it is possible to produce the micro LED display device 100 shown in FIG. 2, or various self-luminous displays consisting of a similar layer configuration.

Herein, for example, in the micro LED display device 100, a black light-shielding layer is normally arranged as an optical member configuring the display panel 2. This black light-shielding layer can be configured by establishing a sticking layer which bonds the encapsulant sheet 1 and display panel as a black layer, for example. By using the encapsulant sheet 1 of the third embodiment as the encapsulant sheet, the encapsulant sheet 1 can contribute to an improvement in overall productivity of self-luminous displays such as the micro LED display device 100, also in the point of reworking (re-sticking) of this sticking layer portion becoming possible Fourth Embodiment Encompassed by Present Embodiment The fourth embodiment specifically provides the following.

A thirty-second aspect of the present invention is a direct backlight comprising: the encapsulant sheet as described in any one of the first to tenth aspects; and a light emitting module in which a plurality of light emitting elements is mounted to a wiring substrate, in which the encapsulant sheet is laminated to the light emitting module to cover the light emitting element and the wiring substrate.

According to the thirty-second aspect of the present invention, it is possible to acquire the above respective effects which can be exhibited by the encapsulant sheet as described in any one of the first to tenth aspects, and obtain a direct backlight superior in optical characteristics, durability and productivity.

According to a thirty-third aspect of the present invention, in the direct backlight as described in the thirty-second aspect, the light emitting element is an LED element.

According to a thirty-fourth aspect of the present invention, in the direct backlight as described in the thirty-third aspect, the LED element has an LED light emitting chip and a resin cover which covers the LED light emitting chip, width and depth of the LED element are both no more than 300 μm, and height is no more than 200 μm, and an arrangement interval of each of the LED elements is at least 0.03 mm and no more than 100 mm.

According to a thirty-fifth aspect of the present invention, in the direct backlight as described in the thirty-fourth aspect, width and depth of the LED element are both no more than 50 μm, and height is no more than 10 μm, and an arrangement interval of each of the LED elements is at least 0.05 mm and no more than 5 mm.

Any of the thirty-third to thirty-fifth aspects of the present invention can obtain direct backlight-type LED display devices superior in optical characteristics, durability and productivity, while dealing with the size and arrangement of various LED elements.

According to a thirty-sixth aspect of the present invention, the direct backlight as described in any one of the thirty-second to thirty-fifth aspects, comprises a light emitting surface made by a plurality of the light emitting modules being joined on the same plane, in which the encapsulant sheet is laminated on the light emitting surface.

The thirty-sixth aspect of the present invention carries out enlargement of the screen size of various LED display devices, by joining a plurality of direct backlights configured using the above-mentioned encapsulant sheet according to the present invention. The above-mentioned encapsulant sheet according to the present invention is superior in surface smoothness after joining by thermal lamination; therefore, it is possible to perform screen enlargement of the LED display device with a high degree of design freedom, without causing a decline in screen quality accompanying the joining of the above-mentioned direct backlight modules.

A thirty-seventh aspect of the present invention is an LED display device comprising: the direct backlight as described in any one of the thirty-second to thirty-sixth aspects; a diffusion panel; and a display panel, in which the diffusion plate is laminated to the peeling surface of the encapsulant sheet configuring the direct backlight.

According to the thirty-seventh aspect of the present invention, it is possible to establish a device superior in productivity and durability of a direct backlight-type LED display device.

A thirty-eighth aspect of the present invention is a direct backlight comprising: the encapsulant sheet as described in any one of the sixteenth to nineteenth aspects; and a light emitting module in which a plurality of light emitting elements is mounted to a wiring substrate, in which the encapsulant sheet is laminated to the light emitting module to cover the light emitting elements and the wiring substrate.

According to the thirty-eighth aspect of the present invention, it is possible to acquire the above respective effects which can be exhibited by the encapsulant sheet as described in any one of the sixteenth to nineteenth aspects, and obtain a direct backlight superior in optical characteristics, durability and productivity.

A thirty-ninth aspect of the present invention is an LED display device comprising: the direct backlight as described in the thirty-eighth aspect; a diffusion panel; and a display panel, in which the diffusion plate is laminated to the peeling surface of the encapsulant sheet configuring the direct backlight.

According to the thirty-ninth aspect of the present invention, it is possible to acquire the above respective effects which can be exhibited by the direct back light of the thirty-eighth aspect, and obtain an LED display device superior in optical characteristics, durability and productivity.

A fortieth aspect of the present invention is a reworking method of the direct backlight as described in the thirty-eighth aspect, comprising: sequentially performing a thermal lamination step divided into two stages of processing of an initial lamination processing and final curing processing to integrate a laminate body including a light emitting module and an encapsulant sheet laminated to cover light emitting elements configuring the light emitting module; and performing a reworking step accompanying an operation to cut out a part of the encapsulant sheet and peel from the light emitting module, after completion of the initial lamination processing and before start of the final curing processing.

The fortieth aspect of the present invention can achieve at preferable levels both adhesion durability during long term use as an LED display device, and reworkability in the manufacturing stage process, for a direct backlight configured using the encapsulant sheet as described in the sixteenth aspect, for example.

A forty-first aspect of the present invention is a backlight comprising: the encapsulant sheet as described in any one of the twenty-fifth to twenty-eighth aspects; and a light emitting module in which a plurality of light emitting elements is mounted to a wiring substrate, in which the encapsulant sheet is laminated to the light emitting module to cover the light emitting element and the wiring substrate. According to the forty-first aspect of the present invention, it is possible to acquire the above respective effects which can be exhibited by the encapsulant sheet as described in any one of the twenty-fifth to twenty-eighth aspects, and obtain a direct backlight superior in optical characteristics, durability and productivity.

A forty-second aspect of the present invention is a liquid crystal display comprising: the direct backlight as described in the forty-first aspect; a diffusion panel; and a display panel, in which the diffusion plate is laminated to the peeling surface of the encapsulant sheet configuring the direct backlight.

According to the forty-second aspect of the present invention, it is possible to acquire the above respective effects which can be exhibited by the direct backlight of the forty-first aspect, and obtain a liquid crystal display superior in optical characteristics, durability and productivity.

A forty-third aspect of the present invention is a production method of the direct backlight as described in the forty-first aspect, comprising: a thermal lamination step of integrating a laminate body in which the light emitting module and the encapsulant sheet are laminated, by thermal press bonding in a state placing on a heated plate including metal and/or glass, in which the thermal press bonding is performed by directly placing the peeling surface of the encapsulant sheet configuring the laminate body on the heated plate, without going through a mold release film.

The forty-third aspect of the present invention defines the technical concept according to the twenty-fifth aspect of the present invention as a production method of direct backlights. This production method can produce the direct backlight with higher productivity, while keeping quality which is at least equal to conventional, even without using a mold release film, by using the encapsulant sheet combining adhesiveness to the circuit board surface having fine unevenness, and mold releasability from a heated plate on which placed during thermal lamination processing.

Hereinafter, the fourth embodiment will be explained more specifically. It should be noted that, due to sharing with the first, second or third embodiment, an explanation for the encapsulant sheet will be omitted.

(Direct Backlight)

Figure 7:
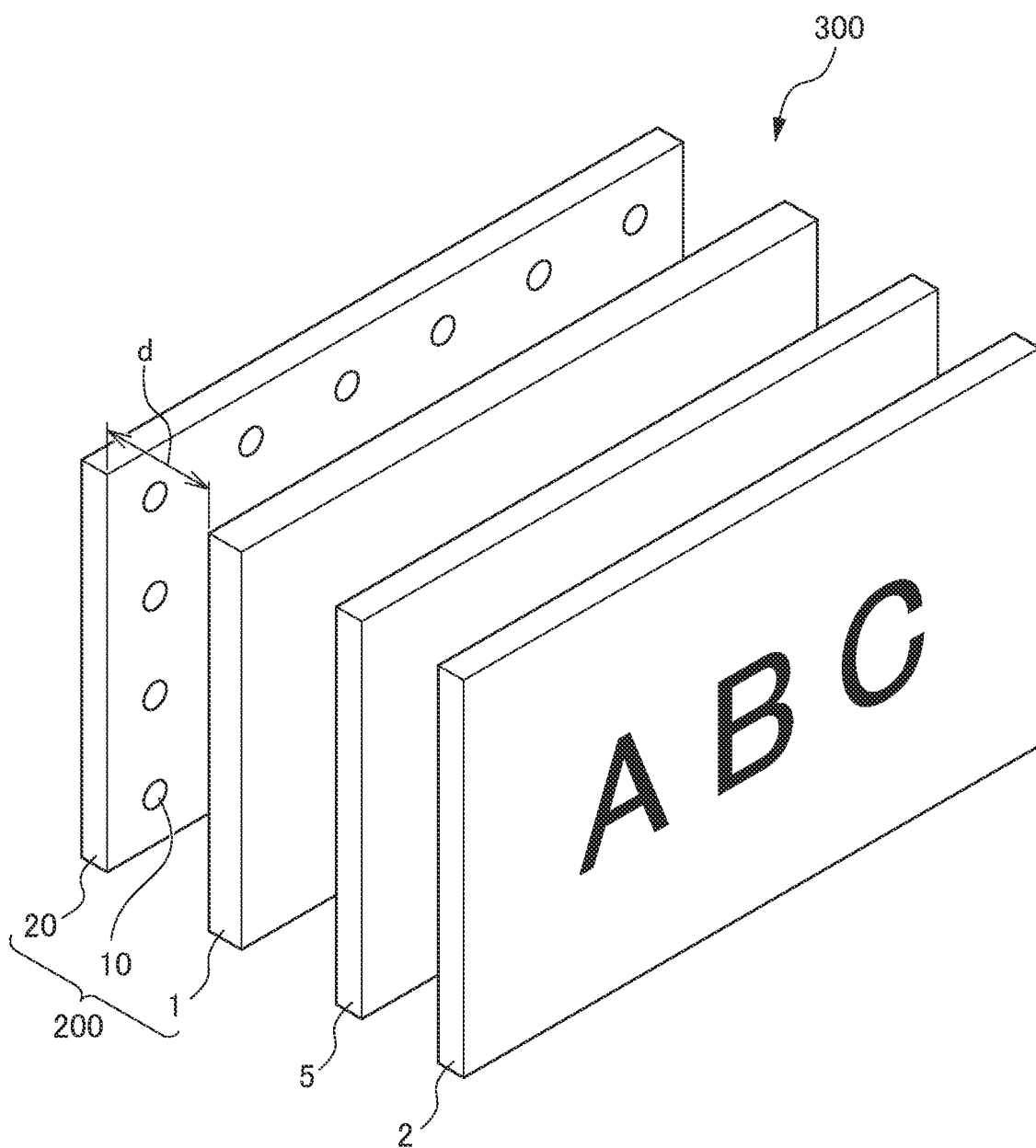
FIG. 7 is a perspective view which schematically shows an example of a configuration of an LED display device made using a direct LED backlight of a fourth embodiment.

The liquid crystal display includes a display screen such as a liquid crystal display panel, and a backlight which illuminates this display screen from the back side. For example, in the liquid crystal display consisting of the basic configuration shown in FIG. 7, a direct backlight system can be adopted.

The direct backlight which is the fourth embodiment of the present invention, for example, is a light source unit which can be used as the light source of a liquid crystal display of the aforementioned direct backlight system, and as the encapsulant sheet for encapsulating the light emitting device such as LED elements used in the light source, it is configured to use the encapsulant sheet of the first to third embodiments according to the present invention explained above.

Figure 8:
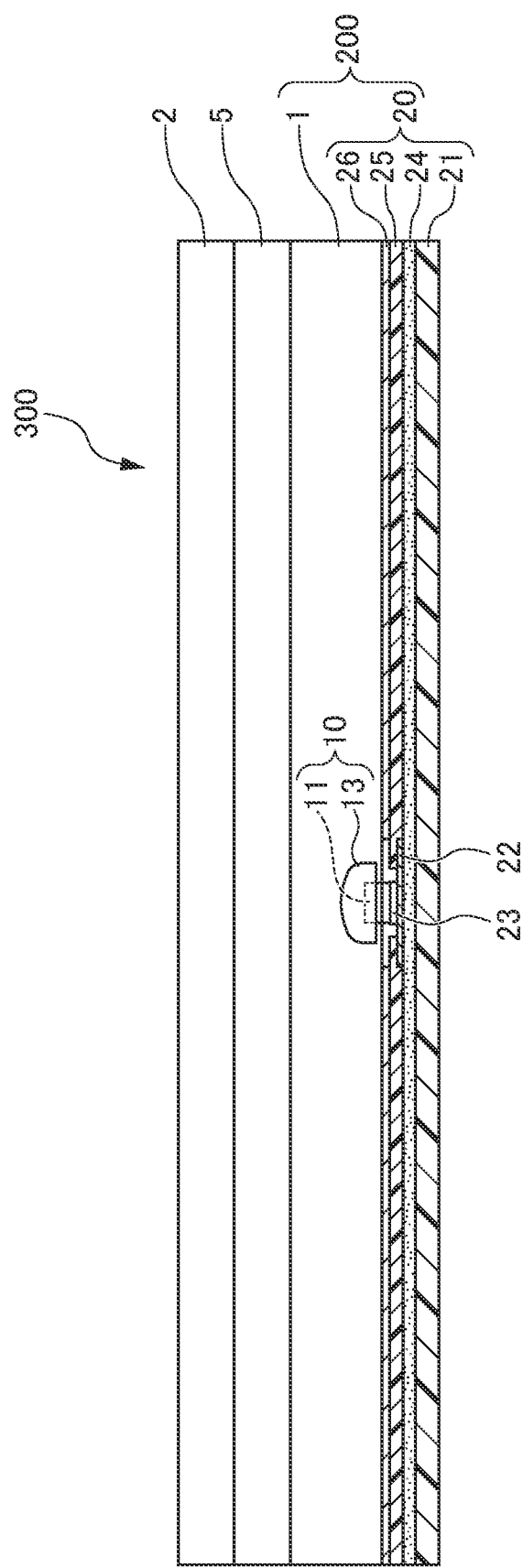
FIG. 8 is a partially enlarged cross-sectional view of the periphery of an installation area of one LED element, in an LED display device made using the direct LED backlight of the fourth embodiment.

As one preferred example of the direct backlight which is the fourth embodiment, it is possible to exemplify a direct LED backlight 200 having the layer configuration shown in FIG. 8. The direct LED backlight 200 is a light emitting module in which a plurality of the LED elements 10 is mounted to the wiring substrate 20, and is a configuration in which the encapsulant sheet 1 of the first to third embodiments according to the present invention is laminated in a form coating the LED elements 10 and writing board 20. As shown in FIG. 8, in the direct LED backlight 200, the optical member such as the diffusion plate 5 is laminated on the LED elements 10 via the encapsulant sheet 1.

As shown in FIG. 8, in the wiring substrate 20 constituting the direct LED backlight 200, a wiring part 22 is normally formed on the support substrate 21 via an adhesive agent layer 24. An insulative protective film 25 is formed on the support substrate 21 and wiring part 22, and further, a reflective layer 26 consisting of a white resin or the like is laminated on the insulative protective film 25. In addition, the LED elements 10 consisting of an LED light emitting chip 11 and light diffusion lens 13 are mounted on the wiring part 22 in an electrically conductible state, via a solder layer 23.

Upon securing the required molding property, by using the encapsulant sheet according to the present invention for which excessive flow of material resin during a heating process is suppressed, it is possible to improve the optical characteristic, durability and productivity of the direct backlight and the liquid crystal display made using this, similarly to the above-mentioned self-luminous display.

Other Embodiments Encompassed by Present Embodiment

The present invention is not limited to the above explained first to fourth embodiments. For example, it is possible to preferably configure a small-scale LED display device, or light source unit of various illumination devices other than a display device, similarly to as described above.

EXAMPLES

Hereinafter, although the present embodiment is explained more specifically by way of the Examples, the present embodiment is not to be limited to the following examples.

1. First Examples (Production of Encapsulant Sheet)

Using a film molding machine having a 30-mm diameter extruder and T die of 200-mm width, the below encapsulant composition formulated for every Example and Comparative Example was made into sheet form with an extruding temperature of 210° C., take-over speed of 1.1 m/min and film thickness of 400 μm to produce the encapsulant sheets of each Example and Comparative Example. It should be noted that for the cooling roller immediately below the T die and the rubber roller, the cooling roller employs a chrome-plated polished cooling roller with surface roughness Rz of 1.5 μm, and the rubber roller employed a silicone rubber roller of 70 degree hardness. The densities of the encapsulant sheets of each Example and Comparative Example after film production were as listed in Table 1.

(Encapsulant Sheet of Example 1-1 (1-1-1~1-1-2)

Relative to 100 parts by mass of the following base resin 1, the above-mentioned additive resin 1 (weatherproofing agent master batch) and the above-mentioned additive resin 2 (silane-modified polyethylene) were mixed in the proportion of 5 parts by mass and 20 parts by mass, respectively, to make the encapsulant composition for molding the encapsulant sheet of the Example 1-1 (1-1-1~1-1-2).

Base Resin 1: Metallocene linear low-density polyethylene (M-LLDPE) with density of 0.901 g/cm$^3$, melting point of 93° C., and MFR at 190° C. of 2.0 g/10 min.

Additive Resin 1 (weatherproofing agent master batch):

Relative to 100 parts by mass of low-density polyethylene with 0.919 g/cm$^3$ density and MFR at 190° C. of 3.5 g/10 min, KEMIS TAB62 (HALS): 0.6 parts by mass
KEMISORB12 (UV absorber): 3.5 parts by mass
KEMISORB79 (UV absorber): 0.6 parts by mass Additive Resin 2 (silane-modified polyethylene): Silane-modified polyethylene obtained by mixing 2 parts by mass of vinyl trimethoxysilane and 0.15 parts by mass of dicumylperoxide as a radical generator (reaction catalyst) relative to 100 parts by mass of metallocene linear low-density polyethylene having density of 0.900 g/cm$^3$ and MFR of 2.0 g/10 min, then melting at 200° C. and kneading. The density of this additive resin 2 is 0.901 g/cm$^3$, and MFR is 1.0 g/10 min.

(Encapsulant Sheet of Example 1-2 (1-2-1~1-2-2)

Relative to 100 parts by mass of the following base resin 2, the above-mentioned additive resin 1 (weatherproofing agent master batch) and the above-mentioned additive resin 2 (silane-modified polyethylene) were mixed in the proportion of 5 parts by mass and 20 parts by mass, respectively, to make the encapsulant composition for molding the encapsulant sheet of the Example 1-2 (1-2-1~1-2-2).

Base Resin 2: Metallocene linear low-density polyethylene (M-LLDPE) having density of 0.898 g/cm$^3$ and MFR at 190° C. of 3.5 g/10 min.

(Encapsulant Sheet of Example 1-3 (1-3-1~1-3-2))

Relative to 100 parts by mass of the following base resin 3, the above-mentioned additive resin 1 (weatherproofing agent master batch) and the above-mentioned additive resin 2 (silane-modified polyethylene) were mixed in the proportion of 5 parts by mass and 20 parts by mass, respectively, to make the encapsulant composition for molding the encapsulant sheet of the Example 1-3 (1-3-1~1-3-2).

Base Resin 3: Metallocene linear low-density polyethylene (M-LLDPE) having density of 0.905 g/cm$^3$ and MFR at 190° C. of 3.5 g/10 min.

(Encapsulant Sheet of Example 1-4 (1-4-1~1-4-2))

Relative to 100 parts by mass of the following base resin 4, the above-mentioned additive resin 1 (weatherproofing agent master batch) and the above-mentioned additive resin 2 (silane-modified polyethylene) were mixed in the proportion of 5 parts by mass and 20 parts by mass, respectively, to make the encapsulant composition for molding the encapsulant sheet of the Example 1-4 (1-4-1~1-4-2).

Base Resin 4: metallocene linear low-density polyethylene (M-LLDPE) having density of 0.919 g/cm$^3$ and MFR at 190° C. of 3.5 g/10 min.

(Encapsulant Sheet of Comparative Example 1-1)

Relative to 100 parts by mass of the following base resin 5, the above-mentioned additive resin 1 (weatherproofing agent master batch) and the above-mentioned additive resin 2 (silane-modified polyethylene) were mixed in the proportion of 3 parts by mass and 10 parts by mass, respectively, to make the encapsulant composition for molding the encapsulant sheet of the Comparative Example 1-1.

Base Resin 5: Metallocene linear low-density polyethylene (M-LLDPE) having density of 0.870 g/cm$^3$ and MFR at 190° C. of 1.0 g/10 min.

(Encapsulant Sheet of Comparative Example 1-2)

Relative to 100 parts by mass of the following base resin 6, the above-mentioned additive resin 1 (weatherproofing agent master batch) and the above-mentioned additive resin 2 (silane-modified polyethylene) were mixed in the proportion of 5 parts by mass and 20 parts by mass, respectively, to make the encapsulant composition for molding the encapsulant sheet of the Comparative Example 1-2.

Base Resin 6: Metallocene linear low-density polyethylene (M-LLDPE) having density of 0.880 g/cm$^3$ and MFR at 190° C. of 30.0 g/10 min.

<Evaluation of Encapsulant Sheet>

(Melt Viscosity of Encapsulant Sheet)

The "melt viscosity (η) at shear velocity 2.43×10 sec$^{-1}$" of each encapsulant sheet of the Examples and Comparative Examples was measured based on JIS K7199 using a Capillograph 1-B manufactured by Toyo Seiki Seisaku-sho, Ltd. and using a capillary tube with setting temperature of 120° C. and D=1 mm, L/D=10. The results are shown as "melt viscosity" in Table 1.

(Vicat Softening Point of Encapsulant Sheet)

The Vicat softening point of each encapsulant sheet of the Examples and Comparative Examples was measured based on ASTM D1525. The results are shown as "Vicat softening point" in Table 1.

(MFR of Encapsulant Sheet)

The MFR of each encapsulant sheet of the Examples and Comparative Examples was measured based on JIS K7210 at conditions of 190° C. and 2.16 kg load. The results are shown as "MFR" in Table 1.

(Durometer a Hardness Measurement of Encapsulant Sheet)

For each encapsulant sheet of the Examples and Comparative Examples, test pieces for hardness measurement with 3 mm thickness were prepared by laminating a plurality of encapsulant material sheets and performing vacuum laminating, and the Durometer A hardness was measured based on JIS K7215. The results are shown as "Hardness" in Table 1.

Evaluation Example 1: Molding Property

For each encapsulant sheet of the Examples and Comparative Examples, the molding property relative to various uneven surfaces was measured by the following test method.
Module Creation for Molding Property Test
Sample 1 (noted as "micro" in list of module irregular surface in Table 1):A total of 15,251 pseudo LED elements made by molding a thermosetting-type epoxy resin so as to have the same external form as an LED element of the micro size of 25 μm width×15 μm depth×2.5 μm height were formed at a pitch of 2 mm on the surface of a glass epoxy substrate of 200×300-mm size, any encapsulant sheet of the respective Examples and Comparative Examples of 300 μm thickness was laminated on the pseudo LED element arrangement surface of this glass epoxy substrate, and a 50-μm ethylene tetrafluoroethylene (ETFE) film which has been single-side corona treated was further laminated on this encapsulant sheet as a surface protective film, vacuum lamination processing was performed at conditions of 150° C., 5 minutes vacuum drawing, 10 minutes press holding at 70 KPa upper chamber pressure, using a vacuum laminator for solar cell module manufacturing, thereby creating a module for molding property testing (Sample 1).
Sample 2 (noted as "small" in list of module uneven surface in Table 1):Other than setting the size of pseudo LED element as 100 μm width×200 μm depth×100 μm height, setting the arrangement pitch thereof as 10 mm, and forming a total of 336, the module for molding property test (Sample 2) was prepared with the same material and method as Sample 1.

Molding property test: Each of the above-mentioned modules for testing was visually observed, and the molding characteristic was evaluated according to the following evaluation criteria.
Evaluation Criteria
A: Perfectly follows unevenness of LED element arrangement surface opposed by encapsulant sheet Formation of voids was not observed.
B: No more than three bubbles of no more than 2 mm² observed.
C: Does not perfectly follow unevenness of LED element arrangement surface opposed by part of encapsulant sheet, and partially laminated defective portion (void) formed in vicinity of pseudo LED element.
Evaluation results noted in Table 1 as "Molding property".

Evaluation Example 2: Film Thickness Uniformity

For each encapsulant sheet of the Examples and Comparative Examples, the film thickness uniformity was measured and evaluated by the following test method using each of the above-mentioned modules for testing, for film thickness uniformity after vacuum laminating performed in the above-mentioned molding test.
Film thickness uniformity test: A laminate body was made of a configuration made by laminating 50-μm untreated ETFE on the back surface of each encapsulant sheet of the Examples and Comparative Examples cut to 30×30 cm as a mold releasing film, and subsequently, further laminating 30×30 cm glass of 3-mm thickness on the back surface, and vacuum lamination processing was performed on this laminate body at the same conditions as Evaluation Example 1. After cooling, the glass and ETFE were peeled, and for the thickness of the encapsulant sheet, the film thickness of at least two points of the central portion and a location 2 cm from the corner towards the center were measured with a digital thickness gauge, and the film thickness uniformity was evaluated according to the following evaluation criteria.
Evaluation Criteria
A: Film thickness difference between central part and location 2 cm from corner less than 12 μm (3%)
B: Film thickness difference between central part and location 2 cm from corner at least 12 μm (3%) and less than 32 μm (8%).
C: Film thickness difference between central part and location 2 cm from corner at least 32 μm (8%). The evaluation results are noted in Table 1 as "Film thickness uniformity".

TABLE 1

|  | Encapsulant sheet | | | | | | | |
|---|---|---|---|---|---|---|---|---|
|  | Density (g/cm³) | Melt viscosity (poise) | Vicat softening point (° C.) | MFR (g/10 min.) | Hardness | Module unevenness | Molding property | Film thickness uniformity |
| Example 1-1 | 0.902 | $8.7 \times 10^4$ | 80 | 1.9 | 91 | Micro | A | A |
| Example1-2 |  |  |  |  |  | Small | B | — |
| Example2-1 | 0.900 | $7.6 \times 10^3$ | 73 | 3.1 | 90 | Micro | A | A |
| Example2-2 |  |  |  |  |  | Small | B | — |
| Example3-1 | 0.905 | $7.6 \times 10^3$ | 84 | 3.1 | 93 | Micro | A | B |
| Example3-2 |  |  |  |  |  | Small | B | — |
| Example4-1 | 0.916 | $7.7 \times 10^3$ | 85 | 3.1 | 93 | Micro | A | B |
| Example4-2 |  |  |  |  |  | Small | B | — |
| Comparative Example1 | 0.870 | $1.2 \times 10^5$ | 48 | 1.5 | 66 | Micro | C | A |
| Comparative Example2 | 0.905 | $1.6 \times 10^3$ | 84 | 12.3 | 73 | Micro | A | C |

The encapsulant sheet of Comparative Example 1-1 came to have insufficient molding property irrespective of MFR being within a range considered desirable. On the other hand, the encapsulant sheet of Comparative Example 1-2 came to have insufficient uniformity in film thickness for self-luminous display, irrespective of the density and Vicat softening point being within ranges considered desirable. In accordance with these results, according to Table 1, the encapsulant sheet of the first example was found to have sufficient molding property to a fine uneven surface, and superior in film thickness uniformity, and thus suited to various self-luminous display applications such as micro LED televisions.

2. Second Examples (Production of Encapsulant Sheet)

Using a film molding machine having a 30-mm diameter extruder and T die of 200-mm width, the below encapsulant composition formulated for every Example and Comparative Example was made into sheet form with an extruding temperature of 210° C., take-over speed of 1.1 m/min and film thickness of 400 μm to produce the encapsulant sheets of each Example and Comparative Example. It should be noted that for the cooling roller immediately below the T die and the rubber roller, the cooling roller employs a chrome-plated polished cooling roller with surface roughness Rz of 1.5 μm, and the rubber roller employed a silicone rubber roller of 70 degree hardness. The densities of the encapsulant sheets of each Example and Comparative Example after film production were as listed in Table 2.

(Encapsulant Sheet of Example 2-1)

Relative to 85 parts by mass of the following base resin, the above-mentioned additive resin 1 (weatherproofing agent master batch) and the following additive resin 2 (silane-modified polyethylene) were mixed in the proportion of 5 parts by mass and 10 parts by mass, respectively, to make the encapsulant composition for molding the encapsulant sheet of the Example 2-1. The silane component amount in the resin component of this encapsulant sheet is 0.037% by mass. Base Resin: Metallocene linear low-density polyethylene (M-LLDPE) with density of 0.901 g/cm³, melting point of 93° C., and MFR at 190° C. of 2.0 g/10 min.
Additive Resin 1 (weatherproofing agent master batch): Relative to 100 parts by mass of low-density polyethylene with density of 0.919 g/cm³ and MFR at 190° C. of 3.5 g/10 min, KEMIS TAB62 (HALS): 0.6 parts by mass.
KEMISORB12 (UV absorber): 3.5 parts by mass
KEMISORB79 (UV absorber): 0.6 parts by mass
Additive Resin 2 (silane-modified polyethylene): Silane-modified polyethylene obtained by mixing 5 parts by mass of vinyl trimethoxysilane and 0.15 parts by mass of dicumylperoxide as a radical generator (reaction catalyst) relative to 95 parts by mass of metallocene linear low-density polyethylene having a density of 0.898 g/cm³ and MFR of 3.5 g/10 min, then melting at 200° C. and kneading. The density of this additive resin 2 is 0.901 g/cm³, and MFR is 1.0 g/10 min. In addition, as a result of measuring the content (% by mass) of "graft silane component" in this silane-modified polyethylene by the aforementioned ICP emission spectral analysis, the graft silane component amount in the additive resin 2 (silane-modified polyethylene) was 0.37% by mass and the unreacted silane component was 0.05% by mass, and 88.1% by mass in all of these silane components was graft silane component.

(Encapsulant Sheet of Example 2-2)

Relative to 87.5 parts by mass of the above-mentioned base resin, the above-mentioned additive resin 1 (weatherproofing agent master batch) and the above-mentioned additive resin 2 (silane-modified polyethylene) were mixed in the proportion of 5 parts by mass and 7.5 parts by mass, respectively, to make the encapsulant composition for molding the encapsulant sheet of the Example 2-2. The silane component amount in the resin component of this encapsulant sheet is 0.025% by mass.

(Encapsulant Sheet of Example 2-3)

Relative to 82.5 parts by mass of the above-mentioned base resin, the above-mentioned additive resin 1 (weatherproofing agent master batch) and the above-mentioned additive resin 2 (silane-modified polyethylene) were mixed in the proportion of 5 parts by mass and 12.5 parts by mass, respectively, to make the encapsulant composition for molding the encapsulant sheet of the Example 2-3. The silane component amount in the resin component of this encapsulant sheet is 0.047% by mass.

(Encapsulant Sheet of Example 2-4)

Relative to 80 parts by mass of the above-mentioned base resin, the above-mentioned additive resin 1 (weatherproofing agent master batch) and the above-mentioned additive resin 2 (silane-modified polyethylene) were mixed in the proportion of 5 parts by mass and 15 parts by mass, respectively, to make the encapsulant composition for molding the encapsulant sheet of the Example 2-4. The silane component amount in the resin component of this encapsulant sheet is 0.056% by mass.

(Encapsulant Sheet of Example 2-5)

Relative to 70 parts by mass of the above-mentioned base resin, the above-mentioned additive resin 1 (weatherproofing agent master batch) and the above-mentioned additive resin 2 (silane-modified polyethylene) were mixed in the proportion of 5 parts by mass and 25 parts by mass, respectively, to make the encapsulant composition for molding the encapsulant sheet of the Example 2-5. The silane component amount in the resin component of this encapsulant sheet is 0.093% by mass.

(Encapsulant Sheet of Example 2-6)

For the encapsulant compositions described below, using a film molding machine having a T die of 300-mm width and the first layer (adhesive layer): 30-mm diameter extruder, second layer (base layer): 30-mm diameter extruder and third layer (adhesive layer): 30-mm diameter extruder, the molten resins of the three layers of adhesive layer-base layer-adhesive layer were made into sheet form in the configuration of layer ratios 1:3:1, at an extruding temperature of 210° C., take-over speed of 1.1 m/min and film thickness of 150 μm to produce the encapsulant sheet of Example 2-6. It should be noted that for the cooling roller immediately below the T die and the rubber roller, the cooling roller employs a chrome-plated polished cooling roller with surface roughness Rz of 1.5 μm, and the rubber roller employed a silicone rubber roller of 70 degree hardness.
Encapsulant Composition for Adhesive Layer (First Layer and Third Layer): A composition consisting of the same materials and composition as the encapsulant sheet of the above Example 2-1 was used.
Encapsulant Composition for Base Layer (Second Layer): A composition made by mixing the above-mentioned "additive resin 1 (weatherproofing agent master batch)" and "additive resin 2 (silane-modified polyethylene)" in the proportions of 5 parts by mass and 1 parts by mass, respectively, relative to 94 parts by mass of the above "Base Resin 1" was used. The silane component amount in the resin component of the "adhesive layer" of this encapsulant sheet is 0.037% by mass, similarly to the encapsulant sheet of Example 2-1 (for Example 2-6, the silane component amount listed in Table 2 is the content in this adhesive layer).

(Encapsulant Sheet of Comparative Example 2-1)

Relative to 90 parts by mass of the following base resin, the above-mentioned additive resin 1 (weatherproofing agent master batch) and the above-mentioned additive resin 2 (silane-modified polyethylene) were mixed in the proportion of 5 parts by mass and 5 parts by mass, respectively, to make the encapsulant composition for molding the encapsulant sheet of the Comparative Example 2-1. The silane component amount in the resin component of this encapsulant sheet is 0.019% by mass.

(Encapsulant Sheet of Comparative Example 2-2)

Relative to 45 parts by mass of the following base resin, the above-mentioned additive resin 1 (weatherproofing agent master batch) and the above-mentioned additive resin 2 (silane-modified polyethylene) were mixed in the proportion of 5 parts by mass and 50 parts by mass, respectively, to make the encapsulant composition for molding the encapsulant sheet of the Comparative Example 2-2. The silane component amount in the resin component of this encapsulant sheet is 0.190% by mass.

<Evaluation of Encapsulant Sheet>

(Gel Fraction of Encapsulant Sheet)

Regarding each encapsulant sheet of the Examples and Comparative Examples, 0.1 g of each encapsulant sheet was placed on resin mesh, and extracted for 4 hours with toluene at 60° C., then after taking out every resin mesh, drying and weighing, mass comparison of before and after extraction was performed to measure the mass % of residual insoluble matter, thereby measuring the gel fraction. The gel fraction for all encapsulant materials was 0%.

(First Adhesive Strength and Second Adhesive Strength of Encapsulant Sheet)

For each encapsulant sheet of the Examples and Comparative Examples, the following first adhesion test and second adhesion test was performed, and the first adhesive strength and second adhesive strength for each encapsulant sheet were measured. The results were as noted in Table 2.

First adhesion test: Lamination processing was performed in a vacuum heated laminator at 140° C. for 10 minutes by adhering the encapsulant sheet sample cut to the size of 75×50 mm on a glass epoxy plate (75 mm×50 mm×0.05 mm), and in a state penetrating to immediately above the glass epoxy plate surface with 15 mm width in the encapsulant sheet sample adhered on the glass epoxy plate, making a cut serving as the start for the peeling start location, and then performing a vertical peeling (50 mm/min) test with a peel testing machine (Tensilon universal testing machine RTF-1150-H) to measure a first adhesive strength.

Second adhesion test: Lamination processing was performed in a vacuum heated laminator at 140° C. for 10 minutes by adhering the encapsulant sheet sample cut to the size of 75×50 mm on a glass epoxy plate (75 mm×50 mm×0.05 mm), and subsequently, curing treatment was further performed in the vacuum heated laminator at 150° C. for 15 minutes, and in a state penetrating to immediately above the glass epoxy plate surface with 15 mm width in the encapsulant sheet sample adhered on the glass epoxy plate, making a cut serving as the start for the peeling start location, and then performing a vertical peeling (50 mm/min) test with a peel testing machine (Tensilon universal testing machine RTF-1150-H) to measure a second adhesive strength.

(Adhesive Strength Durability Test)

For each of the Examples and Comparative Examples, after performing two-stage heat treatment processing (lamination processing and curing processing) by the same conditions as the above-mentioned second adhesion test, durability test was further performed for 500 hours at the condition of 85° C. and 85% with a moisture heat testing machine of a convection circulation type, and after the elapse of 500 hours, measurement of the adhesive strength was performed by a peel testing machine at the same conditions as the above-mentioned first and second adhesion tests. The results were as noted in Table 2 as "500 h adhesive strength".

(Evaluation Example 1: Reworkability)

For each encapsulant sheet of the Examples and Comparative Examples, reworkability evaluation was carried out by the following test method. A pseudo LED element made by molding a thermosetting-type epoxy resin so as to have the same external form as an LED element of the size of 100 μm width×100 μm depth×100 μm height was formed at a pitch of 2 mm on the surface of a glass epoxy substrate of 200×300-mm size, any encapsulant sheet of the respective Examples and Comparative Examples of 150 μm thickness was laminated on the above-mentioned pseudo LED element arrangement surface of this glass epoxy substrate, and a 50-μm ethylene tetrafluoroethylene (ETFE) film which has been single-side corona treated was further laminated on this encapsulant sheet as a surface protective film, vacuum lamination processing was performed at conditions of 140° C., 3 minutes vacuum drawing, 7 minutes press holding at 70 KPa upper chamber pressure, using a vacuum laminator for solar cell module manufacturing, thereby conducting initial lamination processing. Subsequently, a part of the encapsulant sheet, which is a portion of an area of 2×2 mm size including one pseudo LED element was assumed as a reworking portion and was peeled off with a scalpel with a sharp tip, the existence/absence of cohesive peeling of the encapsulant sheet at the peripheral part of this peeling area (reworking portion) was confirmed, subsequently, an encapsulant piece obtained by cutting the same encapsulant sheet in a state prior to vacuum lamination to the size of 2×2 mm was placed in the peeled off location, lamination processing (final curing processing) at the conditions of a temperature of 150° C. and for 15 minutes was conducted again with the same method as described above, and the external appearance of the above reworked portion thereafter was observed to evaluate the reworkability. It should be noted that, since the initial adhesion (first adhesive strength) for Comparative Example 2-1 was insufficient, this evaluation was not carried out.

Evaluation Criteria

A: No cohesive peeling of encapsulant sheet at edge part of peeling range of encapsulant sheet, no damage of pseudo LED element, and after final curing processing, the encapsulant sheet perfectly followed unevenness of the LED element arrangement surface including reworking portions, and the external appearance was favorable.

B: Cohesive peeling of encapsulant sheet at edge part of peeling range of encapsulant sheet was observed; however, no damage of pseudo LED element, and after final curing processing, the encapsulant sheet perfectly followed unevenness of the LED element arrangement surface including working portions. However, small foreign substances derived from the above cohesive peeling remained in encapsulant sheet, and external appearance deteriorated.

C: Cohesive peeling of encapsulant sheet at edge part of peeling range of encapsulant sheet was observed, and pseudo LED element was damaged while peeling off reworked portion.

(Evaluation Example 2: Long Term Durability)

Based on the above results of the adhesive strength durability test, the long term durability of each encapsulant sheet of the Examples and Comparative Examples was evaluated.

Evaluation Criteria

A: "500 h adhesive strength" at least 10 N/15 mm

B: "500 h adhesive strength" at least 6 N/15 mm and less than 10 N/15 mm

C: "500 h adhesive strength" less than 6 N/15 mm

The evaluation results are noted in Table 2 as "Long term durability".

TABLE 2

|  | Silane component (mass %) | First adhesive strength (N/15 mm) | Second adhesive strength (N/15 mm) | 500 h adhesive strength (N/15 mm) | Reworkability | Long term durability |
|---|---|---|---|---|---|---|
| Example1 | 0.037 | 5.8 | 11.6 | 10.5 | A | A |
| Example2 | 0.025 | 4.1 | 9.7 | 9.5 | A | B |
| Example3 | 0.047 | 6.0 | 14.0 | 12.1 | A | A |
| Example4 | 0.056 | 6.3 | 14.0 | 12.6 | A | A |
| Example5 | 0.093 | 6.6 | 11.4 | 13.0 | A | A |
| Example6 | 0.037 | 6.0 | 7.2 | 11.0 | A | A |
| Comparative Example1 | 0.019 | 1.6 | 7.2 | 5.2 | — | C |
| Comparative Example2 | 0.19 | 12.0 | 16.0 | 15.8 | C | A |

According to Table 2, the encapsulant sheet for self-luminous displays of the second example was found to be an encapsulant sheet combining adhesion durability during long term use as a self-luminous display such as a micro LED television, and reworkability in the manufacturing stage.

3. Third Examples (Production of Encapsulant Sheet)

In order to create a multi-layer encapsulant sheet, encapsulant compositions formulated for every layer of the first layer, second layer and third layer were made into sheet form using a film molding machine (30-mm diameter extruder) having a T die of 300-mm width, by coextruding to make the layer order of first layer-second layer-third layer with an extruding temperature of 210° C., and take-over speed of 1.1 m/min, thereby producing the encapsulant sheets of each Example and Comparative Example. It should be noted that for the cooling roller immediately below the T die and the rubber roller, the cooling roller employs a chrome-plated polished cooling roller with surface roughness Rz of 1.5 μm, and the rubber roller employed a silicone rubber roller of 70 degrees hardness.

(Encapsulant Sheet of Example 3-1)

Encapsulant Composition of First Layer (Adhesive Layer): The following "additive resin 1 (weatherproofing agent master batch)" and "additive resin 2 (silane-modified polyethylene)" were mixed in the proportions of 5 parts by mass and 15 parts by mass, respectively, relative to 80 parts by mass of the following "base resin 1". The density of the first layer (adhesive layer) of the encapsulant sheet of Example 3-1 consisting of the above formulation is 0.901 g/cm$^3$, and the silane component amount in the resin component of the same layer is 0.056% by mass.

Encapsulant Composition for Second Layer (Base Layer): The following "additive resin 1 (weatherproofing agent master batch)" and "additive resin 2 (silane-modified polyethylene)" were mixed in the proportions of 5 parts by mass and 1 part by mass, respectively, relative to 94 parts by mass of the following "base resin 1". The density of the second layer (base layer) of the encapsulant sheet of Example 3-1 consisting of the above formulation is 0.902 g/cm$^3$, and the silane component amount in the resin component of the same layer is 0.004% by mass.

Encapsulant Composition of Third Layer (Non-Adhesive Layer): The following "additive resin 1 (weatherproofing agent master batch)" and "additive resin 2 (silane-modified polyethylene)" were mixed in the proportions of 5 parts by mass and 0 parts by mass, respectively, relative to 95 parts by mass of the following "base resin 1". The density of the third layer (non-adhesive layer) of the encapsulant sheet of Example 3-1 consisting of the above formulation is 0.902 g/cm$^3$, and the silane component amount in the resin component of the same layer is 0% by mass. The encapsulant sheet of Example 3-1 was made by coextruding the above-mentioned first layer-second layer-third layer in thickness ratio of each layer of 1:8:1, and total thickness of all layers of 150 μm.

(Encapsulant Sheet of Example 3-2)

The encapsulant sheet of Example 3-2 was made by coextruding the above-mentioned first layer-second layer-third layer using the same materials as the compositions for each layer used in Example 3-1, in thickness ratio of each layer of 1:6:1, and total thickness of all layers of 600 μm.

(Encapsulant Sheet of Example 3-3)

The encapsulant sheet of Example 3-3 was made by coextruding the above-mentioned first layer-second layer-third layer using the same materials as the compositions for each layer used in Example 3-1, in thickness ratio of each layer of 1:5:1, and total thickness of all layers of 70 μm.

(Encapsulant Sheet of Comparative Example 3-1)

Encapsulant Composition for First Layer (Adhesive Layer): The following "additive resin 1 (weatherproofing agent master batch)" and "additive resin 2 (silane-modified polyethylene)" were mixed in the proportions of 5 parts by mass and 15 parts by mass, respectively, relative to 80 parts by mass of the following "base resin 1". The density of the first layer (adhesive layer) of the encapsulant sheet of Comparative Example 3-1 consisting of the above formulation is 0.901 g/cm$^3$, and the silane component amount in the resin component of the same layer is 0.056% by mass.

Encapsulant Composition for Second Layer (Base Layer): The following "additive resin 1 (weatherproofing agent master batch)" and "additive resin 2 (silane-modified polyethylene)" were mixed in the proportions of 5 parts by mass and 1 parts by mass, respectively, relative to 94 parts by mass of the following "base resin 1". The density of the second layer (base layer) of the encapsulant sheet of Comparative Example 3-1 consisting of the above formulation is 0.902 g/cm$^3$, and the silane component amount in the resin component of the same layer is 0.004% by mass.

Encapsulant Composition for Third Layer: The same composition as the first layer was used. The encapsulant sheet of Comparative Example 3-1 was made by coextruding the above-mentioned first layer-second layer-third layer, in thickness ratio of each layer of 1:8:1, and total thickness of all layers of 150 μm.

(Encapsulant Sheet of Comparative Example 3-2)

Encapsulant Composition for First Layer (Non-adhesive Layer): The following "additive resin 1 (weatherproofing agent master batch)" and "additive resin 2 (silane-modified polyethylene)" were mixed in the proportions of 5 parts by mass and 0 parts by mass, respectively, relative to 95 parts by mass of the following "base resin 1". The density of the first layer (non-adhesive layer) of the encapsulant sheet of Comparative Example 3-2 consisting of the above formulation is 0.902 g/cm$^3$, and the silane component amount in the resin component of the same layer is 0% by mass.

Encapsulant Composition for Second Layer (Base Layer): The following "additive resin 1 (weatherproofing agent master batch)" and "additive resin 2 (silane-modified polyethylene)" were mixed in the proportions of 5 parts by mass and 1 parts by mass, respectively, relative to 94 parts by mass of the following "base resin 1". The density of the second layer (base layer) of the encapsulant sheet of Comparative Example 3-2 consisting of the above formulation is 0.902 g/cm$^3$, and the silane component amount in the resin component of the same layer is 0.004% by mass.

Encapsulant Composition for Third Layer: The same composition as the first layer was used. The encapsulant sheet of Comparative Example 3-2 was made by coextruding the above-mentioned first layer-second layer-third layer, in thickness ratio of each layer of 1:8:1, and total thickness of all layers of 150 μm.

The following resin material was used in the production of each of the above-mentioned encapsulant sheet in the third examples.

Base Resin 1: Metallocene linear low-density polyethylene (M-LLDPE) with density of 0.901 g/cm$^3$, melting point of 93° C., and MFR at 190° C. of 2.0 g/10 min.

Additive Resin 1 (weatherproofing agent master batch): Relative to 100 parts by mass of low-density polyethylene with 0.919 g/cm$^3$ density and MFR at 190° C. of 3.5 g/10 min, KEMIS TAB62 (HALS): 0.6 parts by mass.
KEMISORB12 (UV absorber): 3.5 parts by mass
KEMISORB79 (UV absorber): 0.6 parts by mass Additive Resin 2 (silane-modified polyethylene): Silane-modified polyethylene obtained by mixing 5 parts by mass of vinyl trimethoxysilane and 0.15 parts by mass of dicumylperoxide as a radical generator (reaction catalyst) relative to 100 parts by mass of metallocene linear low-density polyethylene having a density of 0.898 g/cm$^3$ and MFR of 3.5 g/10 min, then melting at 200° C. and kneading. The density of this additive resin 2 is 0.901 g/cm$^3$, and MFR is 1.0 g/10 min.

<Evaluation of Encapsulant Sheet>

Evaluation Example 1: Adhesive Strength (Adhesive Surface and Peeling Surface)

For each encapsulant sheet of the Examples and Comparative Examples, the following adhesion test was performed in order to measure the adhesive strength of each surface. The results were as noted in Table 3. Adhesion Test: Lamination processing was performed in a vacuum heated laminator at 140° C. for 10 minutes by adhering the first layer of each encapsulant sheet sample cut to the size of 75×50 mm on blue-sheet glass (75 mm×50 mm×3 mm), and in a state penetrating to immediately above the blue-sheet glass plate surface with 15 mm width in the encapsulant sheet sample adhered on the glass epoxy plate, making a cut serving as the start for the peeling start location, and then performing a vertical peeling (50 mm/min) test with a peel testing machine (Tensilon universal testing machine RTF-1150-H) to measure the adhesive strength of the adhesive surface. In addition, for the Examples, the same test was performed by adhering the third layer of each of the above-mentioned encapsulant sheet material onto blue-sheet glass (75 mm×50 mm×3 mm) to measure the adhesive strength of the peeling surface. The evaluation results are noted in Table 3 as "Adhesive strength".

Evaluation Example 2: Peeling Property after Thermal Lamination

For each encapsulant sheet of the Examples and Comparative Examples, an operation of tearing away the encapsulant sheet by manual operation from the glass plate was performed at the interface of the encapsulant sheet/blue-sheet glass, after adhering the third layer onto the blue-sheet glass (75 mm×50 mm×3 mm) at the same conditions as the above-mentioned adhesion test, the state of the interface after tearing away was observed visually, and the peeling property after thermal lamination was evaluated based on the following evaluation criteria. The evaluation results are noted in Table 3 as "peeling property".

Evaluation Criteria

A: Peeling off of the encapsulant sheet by manual operation could be easily performed. In addition, cohesive peeling of encapsulant sheet at edge part of peeling area of encapsulant sheet was not observed.

C: Peeling off of encapsulant sheet by manual operation was somewhat difficult, and cohesive peeling of encapsulant sheet at edge part of peeling area of encapsulant sheet was not observed.

(Reference Test)

It should be noted that, as the reference test, the encapsulant sheet of Comparative Example 3-1 was laminated on the above-mentioned blue-sheet glass via a release film (38 μm thickness) consisting of polyethylene terephthalate, and testing and evaluation of the same conditions were performed; however, if the evaluation according to the following evaluation criteria for "releasability after thermal lamination" of the encapsulant sheet of the Comparative Examples in the case of this reference test being "A", i.e. even if the encapsulant sheet of Comparative Example 3-1, it was confirmed that it could be released without problems so long as using the release film.

Evaluation Example 3: Molding Property

For each encapsulant sheet of the Examples and Comparative Examples, the molding property to an uneven surface was evaluated by the following test method.

Module Preparation for Molding Property Test: A pseudo LED module made by molding a thermosetting-type epoxy resin so as to have the same external form as an LED element of the micro size of 25 μm width×15 μm depth×2.5 μm height and arranging at a pitch of 2 mm on the surface of a glass epoxy substrate of 200×300-mm size is prepared, the first layer any encapsulant sheet of the respective Examples and Comparative Examples is laminated to opposed the pseudo LED element arrangement surface of this module, and a 50-μm ethylene tetrafluoroethylene (ETFE) film which has been single-side corona treated was further laminated on this encapsulant sheet as a surface protective film, vacuum lamination processing was performed at conditions of 150° C., 5 minutes vacuum drawing, 10 minutes press holding at 70 KPa upper chamber pressure, using a vacuum laminator for solar cell module manufacturing, thereby creating a module for molding property testing.

Molding Property Test:

Each of the above-mentioned modules for testing was visually observed to evaluate the molding property based on the following evaluation criteria. The evaluation results are noted in Table 3 as "Molding property".

Evaluation Criteria

A: Perfectly followed unevenness of LED element arrangement surface opposed by encapsulant sheet. Formation of voids was not observed.

B: No more than three bubbles of no more than 2 mm$^2$ observed.

C: Does not perfectly follow unevenness of LED element arrangement surface opposed by part of encapsulant sheet, and partially laminated defective portion (void) formed in vicinity of pseudo LED element.

Evaluation Example 4: Heat Resistance

For each encapsulant sheet of the Examples and Comparative Examples, the heat resistance after vacuum lamination carried out in the above-mentioned molding test was evaluated by the following test method.

Heat Resistance Test: The encapsulant sheet prepared in the Examples and Comparative Examples was sandwiched between a 30×30-cm glass of 3 mm thickness, and a 50×75-cm glass of 3 mm thickness, vacuum lamination processing was performed at conditions of 150° C., 5 minutes vacuum drawing, 10 minutes press holding at 70 KPa upper chamber pressure, using a vacuum laminator for solar cell module manufacturing, and subsequently, was cooled until room temperature to prepare a heat resistance test piece. Subsequently, the cooled test piece was placed vertically in a convection circulation oven at 85° C., and measurement was performed for the shift amount between before charging into the oven and after taking out the 50×75-mm glass of 3-mm thickness after 1000 hours. The heat resistance was evaluated based on the following evaluation criteria for the measurement results. The evaluation results are noted in Table 3 as "Heat resistance".

Evaluation Criteria

A: Shift amount less than 1 mm
B: Shift amount at least 1 mm and less than 10 mm
C: Shift amount at least 10 mm self-luminous displays with higher productivity while maintaining at least equal quality as conventional, even without using a mold release film.

EXPLANATION OF REFERENCE NUMERALS 1 encapsulant sheet
111 base layer
121 non-adhesive layer
122 adhesive layer
123 peeling surface
124 adhesive surface
10 LED element
11 LED light emitting chip
12 resin cover
13 light diffusing lens
20 wiring substrate
21 support substrate
22 wiring part
23 solder layer
24 adhesive layer
25 insulative protective film
26 reflective layer
30 LED module
40 laminator
41 heating plate
42 heating plate (auxiliary heating plate)
43 laminate body holding plate
2 display panel
5 diffuser
100, 100A, 100B micro LED display device (self-luminous display)
200 direct LED backlight
300 liquid crystal display (direct backlight type)

The invention claimed is:

1. An encapsulant sheet for self-luminous displays or direct backlights, wherein the encapsulant sheet is a resin sheet with polyolefin as a base resin,
wherein melt viscosity of the encapsulant sheet measured at a shear rate of 2.43×10 sec-1 and measured at a temperature of 120° C. is at least 5.0×103 poise and no more than 1.0×105 poise.

2. The encapsulant sheet according to claim 1, wherein melt viscosity of the encapsulant sheet measured at a shear rate of 2.43×10 sec-1 and measured at a temperature of 120° C. is at least 5.0×104 poise and no more than 1.0×105 poise.

TABLE 3

| | Adhesive strength (N/15 mm) | | Silane component (mass %) | | | | Molding | Heat |
|---|---|---|---|---|---|---|---|---|
| | First layer | Third layer | First layer | Second layer | Third layer | Releasability | property | resistance |
| Example1 | 11.5 | 0.2 | 0.056 | 0.004 | 0 | A | A | A |
| Example2 | 43 | 0.3 | 0.056 | 0.004 | 0 | A | A | A |
| Example3 | 7.5 | 0.1 | 0.056 | 0.004 | 0 | A | A | A |
| Comparative Example1 | 12.5 | 12.8 | 0.056 | 0.004 | 0.056 | C | A | A |
| Comparative Example2 | 0.3 | 0.3 | 0 | 0.004 | 0 | A | C | A |

According to Table 3, the encapsulant sheet for self-luminous displays of the Third Example was found to be an encapsulant sheet capable of producing an LED module for 3. The encapsulant sheet according to claim 1, wherein Vicat softening point is greater than 60° C. and no higher than 100° C.

4. The encapsulant sheet according to claim 1, wherein the encapsulant sheet is a resin sheet which is black, white or another color.

5. The encapsulant sheet according to claim 1, wherein the encapsulant sheet is a single-layer or a multi-layer resin sheet and the encapsulant sheet includes an adhesive layer exposed at a topmost surface,
wherein the adhesive layer contains a resin component and a silane component,
wherein the resin component includes a polyolefin, and
wherein content of the silane component relative to resin component of the adhesive layer is at least 0.02% by mass and no more than 0.15% by mass.

6. The encapsulant sheet according to claim 5, wherein the silane component includes a graft silane component which graft-polymerizes to the polyolefin of the adhesive layer,
wherein the adhesive layer contains at least 70% by mass and no more than 100% by mass of the graft silane component with respect to the silane component.

7. The encapsulant sheet according to claim 5, wherein the encapsulant sheet is a multi-layer resin sheet in which the adhesive layer is laminated on a base layer with polyethylene as a base resin.

8. The encapsulant sheet according to claim 1, wherein one surface is an adhesive surface, and the other surface is a peeling surface,
wherein adhesive strength of the adhesive surface measured by an adhesion test is at least 5.0 N/15 mm and no more than 50.0 N/15 mm,
wherein the adhesive strength of the peeling surface is at least 0.1 N/15 mm and no more than 3.0 N/15 mm, and
wherein the adhesion test measures adhesive strength of each surface by adhering a surface on a side serving as a measurement target of an encapsulant sheet sample cut to a width of 15 mm onto a blue-sheet glass plate (75 mm×50 mm×3 mm) and performing laminate treatment in a vacuum heated laminator at 140° C. for 10 minutes, and performing a vertical peeling (50 mm/min) test with a peel tester on the encapsulant sheet sample adhered on the blue-sheet glass plate.

9. The encapsulant sheet according to claim 8, wherein the encapsulant sheet is a multi-layer resin sheet having an adhesive layer exposed at a surface on a side of the adhesive surface, and a non-adhesive layer exposed at a surface on a side of the peeling surface,
wherein the adhesive layer contains a silane component in a proportion of at least 0.02% by mass and no more than 0.19% by mass relative to resin component, and
wherein the non-adhesive layer does not contain the silane component, or in a case of containing the silane component, content relative to resin component is less than 0.02% by mass.

10. The encapsulant sheet according claim 8, wherein the encapsulant sheet is a multi-layer resin sheet in which the adhesive layer is laminated on one surface of the base layer with polyethylene as base resin, and the non-adhesive layer is laminated on the other surface of the base layer.

11. A self-luminous display comprising:
the encapsulant sheet according to claim 1;
a display panel; and
a light emitting module in which a plurality of light emitting elements is mounted to a wiring substrate,
wherein the encapsulant sheet is laminated to the light emitting module to cover the light emitting elements and the wiring substrate, and
wherein the display panel is laminated to the encapsulant sheet.

12. The self-luminous display according to claim 11, wherein the light emitting elements are LED elements.

13. The self-luminous display according to claim 12, wherein the LED element has an LED light emitting chip and a resin cover which covers the LED light emitting chip,
wherein width and depth of the LED element are both no more than 300 μm, and height is no more than 200 μm, and
wherein an arrangement interval of each of the LED elements is at least 0.03 mm and no more than 100 mm.

14. The self-luminous display according to claim 13, wherein width and depth of the LED element are both no more than 50 μm, and height is no more than 10 μm, and
wherein an arrangement interval of each of the LED elements is at least 0.05 mm and no more than 5 mm.

15. The self-luminous display according to claim 11, comprising a light emitting surface made by a plurality of the light emitting module being joined on the same plane,
wherein the encapsulant sheet is laminated on the light emitting surface.

16. An encapsulant sheet for a self-luminous display or for a direct backlight which is a single-layer or a multi-layer resin sheet that includes an adhesive layer exposed on a topmost surface,
wherein the adhesive layer contains a resin component and a silane component,
wherein the resin component includes a polyolefin, and
wherein content of the silane component relative to resin component of the adhesive layer is at least 0.02% by mass and no more than 0.15% by mass.

17. The encapsulant sheet according to claim 16, wherein the polyolefin is a polyethylene having a density of at least 0.870 g/cm3 and no more than 0.910 g/cm3.

18. The encapsulant sheet according to claim 16, wherein the silane component includes a graft silane component which graft-polymerizes to the polyolefin of the adhesive layer,
wherein the adhesive layer contains at least 70% by mass and no more than 100% by mass of the graft silane component with respect to the silane component.

19. The encapsulant sheet according to claim 16, wherein the encapsulant sheet is a multi-layer resin sheet in which the adhesive layer is laminated to a base layer with polyethylene as a base resin.

20. A production method of an encapsulant sheet for a self-luminous display or a direct backlight,
wherein the encapsulant sheet is a single-layer or a multi-layer resin sheet configured to contain an adhesive layer exposed at a topmost surface, the method comprising:
an adhesive layer forming step of forming the adhesive layer by melt forming an encapsulant composition for adhesive layer,
wherein the encapsulant composition for adhesive layer contains polyolefin and a silane component, and is free of cross-linking agent,
wherein at least 70% by mass and no more than 100% by mass of silane component among the silane component is a graft silane component which is graft-polymerizing to the polyolefin,
wherein content of the silane component relative to the polyolefin is adjusted so that a first adhesive strength measured by a first adhesion test of the adhesive layer is at least 3.0 N/15 mm and no more than 8.0 N/15 mm, and a second adhesive strength measured by a second adhesion test of the adhesive layer is at least 10.0 N/15 mm and no more than 20.0 N/15 mm, wherein the first adhesion test measures the first adhesive strength by adhering an encapsulant sheet sample cut to a width of 15 mm onto a glass epoxy plate (75 mm×50 mm×0.05 mm) and performing lamination processing in a vacuum heated laminator at 140° C. for 10 minutes, and performing a vertical peeling (50 mm/min) test with a peel tester on the encapsulant sheet sample adhered on the glass epoxy plate, and wherein the second adhesion test measures the second adhesive strength by adhering an encapsulant sheet sample cut to a width of 15 mm onto a glass epoxy plate (75 mm×50 mm×0.05 mm) and performing lamination processing in a vacuum heated laminator at 140° C. for 10 minutes, thereafter further performing curing processing in a vacuum heated laminator at 150° C. for 15 minutes, and performing a vertical peeling (50 mm/min) test with a peel tester on the encapsulant sheet sample adhered on the glass epoxy plate.

21. A self-luminous display comprising:
the encapsulant sheet according to claim 16;
a display panel; and
a light emitting module in which a plurality of light emitting elements are mounted to a wiring substrate,
wherein the encapsulant sheet is laminated to the light emitting module to cover the light emitting elements and the wiring substrate, and
wherein the display panel is laminated to the encapsulant sheet.

22. The self-luminous display according to claim 21, wherein the light emitting element is an LED element,
wherein the LED element has an LED light emitting chip and a resin cover which covers the LED light emitting chip,
wherein width and depth of the LED element are both no more than 300 μm, and height is no more than 200 μm, and
wherein an arrangement interval of each of the LED elements is at least 0.03 mm and no more than 100 mm.

23. The self-luminous display according to claim 22, wherein width and depth of the LED element are both no more than 50 μm, and height is no more than 10 μm, and
wherein an arrangement interval of each of the LED elements is at least 0.05 mm and no more than 5 mm.

24. A reworking method of the self-luminous display according to claim 21, comprising:
sequentially performing a thermal lamination step divided into two stages of processing of an initial lamination processing and final curing processing to integrate a laminate body including a light emitting module and an encapsulant sheet laminated to cover light emitting elements configuring the light emitting module; and
performing a reworking step accompanying an operation to cut out a part of the encapsulant sheet and peel from the light emitting module, after completion of the initial lamination processing and before start of the final curing processing.

25. An encapsulant sheet for a self-luminous display or a direct backlight,
wherein one surface is an adhesive surface, and the other surface is a peeling surface,
wherein adhesive strength of the adhesive surface measured by an adhesion test is at least 5.0 N/15 mm and no more than 50.0 N/15 mm,
wherein adhesive strength of the peeling surface is at least 0.1 N/15 mm and no more than 3.0 N/15 mm, and wherein the adhesion test measures adhesive strength of each surface by adhering a surface on a side serving as a measurement target of an encapsulant sheet sample cut to a width of 15 mm onto a blue-sheet glass plate (75 mm×50 mm×3 mm) and performing laminate processing in a vacuum heated laminator at 140° C. for 10 minutes, and performing a vertical peeling (50 mm/min) test with a peel tester on the encapsulant sheet sample adhered on the blue-sheet glass plate.

26. The encapsulant sheet according to claim 25, wherein a polyethylene having a density of at least 0.870 g/cm3 and no more than 0.930 g/cm3 is the base resin.

27. The encapsulant sheet according to claim 25, wherein the encapsulant sheet is a multi-layer resin sheet having an adhesive layer exposed at a surface on a side of the adhesive surface, and a non-adhesive layer exposed at a surface on a side of the peeling surface,
wherein the adhesive layer contains a silane component in a proportion of at least 0.02% by mass and no more than 0.19% by mass relative to resin component, and
wherein the non-adhesive layer does not contain the silane component, or even in a case of containing silane component, content thereof relative to resin component is less than 0.02% by mass.

28. The encapsulant sheet according to claim 25, wherein the encapsulant sheet is a multi-layer resin sheet in which the adhesive layer is laminated on one surface of a base layer with polyethylene as a base resin, and the non-adhesive layer is laminated on the other surface thereof.

29. An LED module for self-luminous displays, the LED module comprising:
the encapsulant sheet according to claim 25; and
a light emitting module in which a plurality of light emitting elements is mounted on a wiring substrate,
wherein the encapsulant sheet is laminated to the light emitting module in a state opposing the adhesive surface against the light emitting element and the wiring substrate.

30. A self-luminous display comprising:
the LED module for self-luminous displays according to claim 29; and
a display panel,
wherein the display panel is laminated to the peeling surface of the encapsulant sheet configuring the LED module.

31. A production method of the LED module for self-luminous displays according to claim 29, the method comprising:
a thermal lamination step of integrating a laminate body in which the light emitting module and the encapsulant sheet are laminated, by thermal press bonding in a state placing on a heated plate including metal and/or glass,
wherein the thermal press bonding is performed by directly placing the peeling surface of the encapsulant sheet configuring the laminate body on the heated plate, without going through a mold release film.

32. A direct backlight comprising:
the encapsulant sheet according to claim 1; and
a light emitting module in which a plurality of light emitting elements is mounted to a wiring substrate,
wherein the encapsulant sheet is laminated to the light emitting module to cover the light emitting element and the wiring substrate.

33. The direct backlight according to claim 32, wherein the light emitting element is an LED element.

34. The direct backlight according to claim 33, wherein the LED element has an LED light emitting chip and a resin cover which covers the LED light emitting chip,
wherein width and depth of the LED element are both no more than 300 μm, and height is no more than 200 μm, and
wherein an arrangement interval of each of the LED elements is at least 0.03 mm and no more than 100 mm.

35. The direct backlight according to claim 34, wherein width and depth of the LED element are both no more than 50 μm, and height is no more than 10 μm, and
wherein an arrangement interval of each of the LED elements is at least 0.05 mm and no more than 5 mm.

36. The direct backlight according to claim 32, comprising a light emitting surface made by a plurality of the light emitting modules being joined on the same plane, wherein the encapsulant sheet is laminated on the light emitting surface.

37. An LED display device comprising:
the direct backlight according to claim 32;
a diffusion plate; and
a display panel,
wherein the diffusion plate is laminated to the peeling surface of the encapsulant sheet configuring the direct backlight.

38. A direct backlight comprising:
the encapsulant sheet according to claim 16; and
a light emitting module in which a plurality of light emitting elements is mounted to a wiring substrate,
wherein the encapsulant sheet is laminated to the light emitting module to cover the light emitting elements and the wiring substrate.

39. A liquid crystal display comprising:
the direct backlight according to claim 38;
a diffusion plate; and
a display panel,
wherein the diffusion plate is laminated to the peeling surface of the encapsulant sheet configuring the direct backlight.

40. A reworking method of the direct backlight according to claim 38, comprising:
sequentially performing a thermal lamination step divided into two stages of processing of an initial lamination processing and final curing processing to integrate a laminate body including a light emitting module and an encapsulant sheet laminated to cover light emitting elements configuring the light emitting module; and
performing a reworking step accompanying an operation to cut out a part of the encapsulant sheet and peel from the light emitting module, after completion of the initial lamination processing and before start of the final curing processing.

41. A direct backlight comprising:
the encapsulant sheet according to claim 25; and
a light emitting module in which a plurality of light emitting elements is mounted to a wiring substrate,
wherein the encapsulant sheet is laminated to the light emitting module to cover the light emitting element and the wiring substrate.

42. A liquid crystal display comprising:
the direct backlight according to claim 41;
a diffusion plate; and
a display panel,
wherein the diffusion plate is laminated to the peeling surface of the encapsulant sheet configuring the direct backlight.

43. A production method of the direct backlight according to claim 41, the method comprising:
a thermal lamination step of integrating a laminate body in which the light emitting module and the encapsulant sheet are laminated, by thermal press bonding in a state placing on a heated plate including metal and/or glass,
wherein the thermal press bonding is performed by directly placing the peeling surface of the encapsulant sheet configuring the laminate body on the heated plate, without going through a mold release film.

\* \* \* \* \*